United States Patent
Bairo

(10) Patent No.: US 10,629,640 B2
(45) Date of Patent: Apr. 21, 2020

(54) MOS FIELD-EFFECT TRANSISTOR WITH MODIFIED GATE

(71) Applicant: SONY SEMICONDUCTOR SOLUTIONS CORPORATION, Kanagawa (JP)

(72) Inventor: Masaaki Bairo, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/759,965

(22) PCT Filed: Aug. 9, 2016

(86) PCT No.: PCT/JP2016/073433
§ 371 (c)(1),
(2) Date: Mar. 14, 2018

(87) PCT Pub. No.: WO2017/056740
PCT Pub. Date: Apr. 6, 2017

(65) Prior Publication Data
US 2018/0261638 A1 Sep. 13, 2018

(30) Foreign Application Priority Data
Sep. 28, 2015 (JP) .................................. 2015-189169

(51) Int. Cl.
*H01L 31/062* (2012.01)
*H01L 31/113* (2006.01)
(Continued)

(52) U.S. Cl.
CPC .. *H01L 27/14614* (2013.01); *H01L 27/14605* (2013.01); *H01L 29/4238* (2013.01);
(Continued)

(58) Field of Classification Search
None
See application file for complete search history.

(56) References Cited

U.S. PATENT DOCUMENTS 5,641,982 A * 6/1997 Takahashi ........... H01L 29/1083
257/398
7,061,128 B2 * 6/2006 Maki ................. H01L 21/28194
257/368
(Continued)

FOREIGN PATENT DOCUMENTS

CN 104795415 A 7/2015
JP 2005-064190 A 3/2005
(Continued)

OTHER PUBLICATIONS

International Search Report and Written Opinion of PCT Application No. PCT/JP2016/073433, dated Nov. 1, 2016, 11 pages.
(Continued)

*Primary Examiner* — Ismail A Muse
(74) *Attorney, Agent, or Firm* — Chip Law Group

(57) ABSTRACT

A MOS field-effect transistor according to the present disclosure includes: an element isolation region that defines an active region; a source region and a drain region formed in the active region; a gate insulating film provided on a channel region between the source region and the drain region; and a gate electrode provided on the gate insulating film, in which the gate electrode has an electrode shape in which a potential at a border between the element isolation region and the active region becomes shallower than a potential at a channel center part.

13 Claims, 23 Drawing Sheets

(51) Int. Cl.
*H01L 27/146* (2006.01)
*H01L 29/78* (2006.01)
*H01L 29/423* (2006.01)
*H04N 5/3745* (2011.01)

(52) U.S. Cl.
CPC .......... *H01L 29/78* (2013.01); *H01L 27/1463* (2013.01); *H01L 29/42368* (2013.01); *H04N 5/3745* (2013.01)

(56) References Cited

U.S. PATENT DOCUMENTS

| | | | |
|---|---|---|---|
| 2005/0090047 A1* | 4/2005 | Hawley | H01L 21/76237 438/197 |
| 2009/0072280 A1* | 3/2009 | Lee | H01L 21/28123 257/288 |
| 2011/0248356 A1* | 10/2011 | Smith | H01L 27/112 257/390 |
| 2011/0298079 A1* | 12/2011 | Kawahito | H01L 27/14603 257/443 |
| 2014/0191290 A1 | 7/2014 | Funao et al. | |
| 2015/0206920 A1* | 7/2015 | Yamamoto | H01L 27/14887 257/229 |
| 2016/0099286 A1* | 4/2016 | Yamamoto | H01L 27/14887 438/78 |
| 2016/0197110 A1* | 7/2016 | Hung | H01L 21/26506 257/229 |
| 2017/0251157 A1* | 8/2017 | Mizuguchi | H04N 5/3745 |
| 2017/0317123 A1* | 11/2017 | Hung | H01L 27/14616 |

FOREIGN PATENT DOCUMENTS

| | | |
|---|---|---|
| JP | 2011-114036 A | 6/2011 |
| JP | 2013-090305 A | 5/2013 |
| JP | 2015-046586 A | 3/2015 |
| JP | 2015-138851 A | 7/2015 |
| TW | 201312740 A | 3/2013 |
| WO | 2013/027524 A1 | 2/2013 |

OTHER PUBLICATIONS

Takeuchi, et al., "Single-Charge-Based Modeling of Transistor Characteristics Fluctuations Based on Statistical Measurement of RTN Amplitude", Symposium on VLSI Technology, 2009, pp. 54-55.

Takeuchi, et al., "Single-Charge-Based Modeling of Transistor Characteristics Fluctuations Based on Statistical Measurement of RTN Amplitude", 2009 Symposium on VLSI Technology Digest of Technical Papers, pp. 54-55.

* cited by examiner

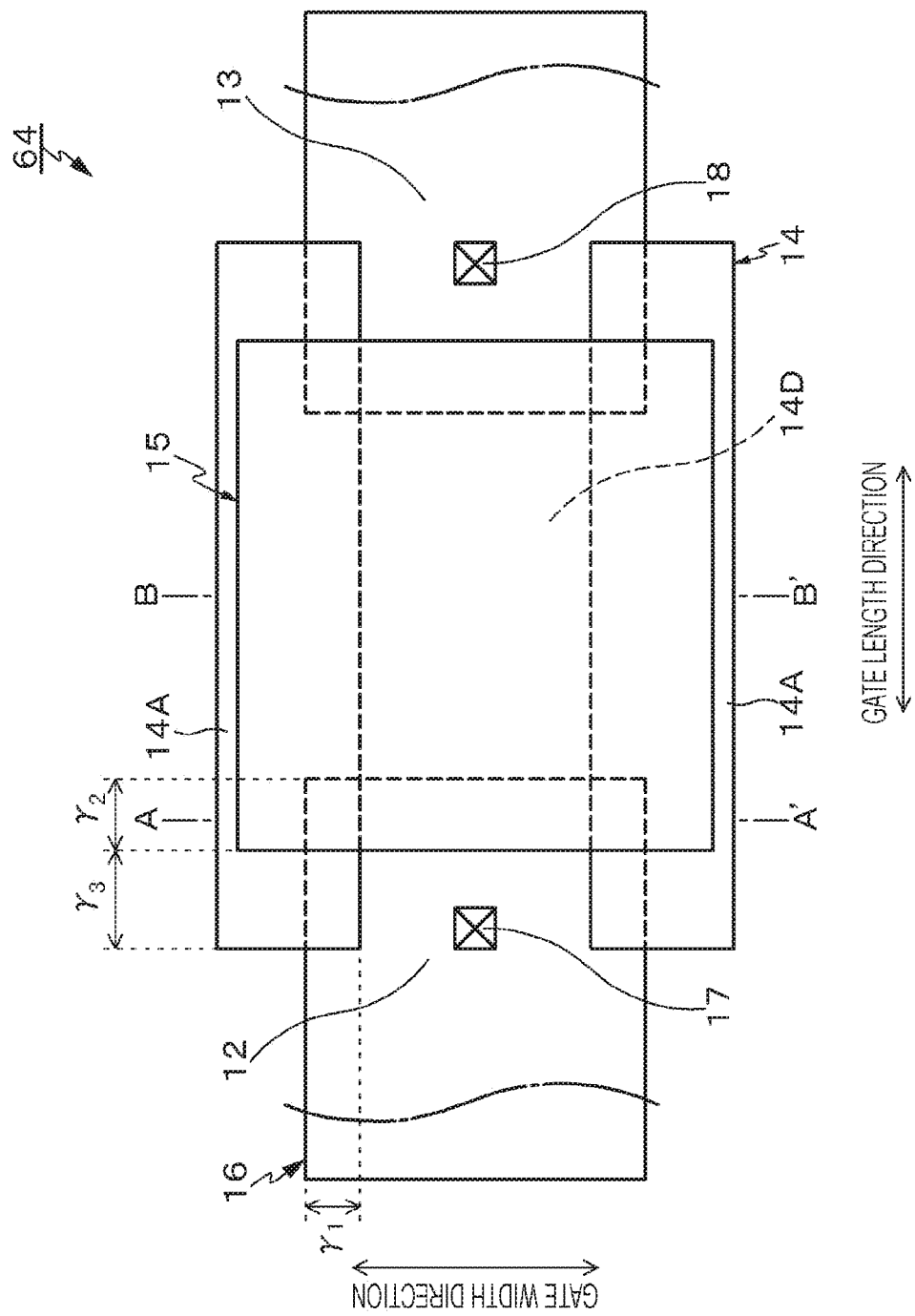

MOS FIELD-EFFECT TRANSISTOR WITH MODIFIED GATE

CROSS REFERENCE TO RELATED APPLICATIONS

This application is a U.S. National Phase of International Patent Application No. PCT/JP2016/073433 filed on Aug. 9, 2016, which claims priority benefit of Japanese Patent Application No. JP 2015-189169 filed in the Japan Patent Office on Sep. 28, 2015. Each of the above-referenced applications is hereby incorporated herein by reference in its entirety.

TECHNICAL FIELD

The present disclosure relates to a MOS field-effect transistor, a semiconductor integrated circuit, a solid-state image sensor, and an electronic device.

BACKGROUND ART

Regarding a semiconductor integrated circuit including a metal-oxide-semiconductor (MOS) field-effect transistor (FET), there has been a problem of random telegraph signal noise (hereinafter, referred to as "RTS noise") caused in the MOSFET. As a semiconductor integrated circuit including a MOS field-effect transistor, for example, a complementary metal oxide semiconductor (CMOS) solid-state image sensor is known. More specifically, a MOS field-effect transistor is used in a comparator that composes an AD conversion unit in a CMOS solid-state image sensor including a column-parallel AD conversion unit for performing, for every pixel column, an AD conversion of an analog pixel signal read from a pixel, for example (see Patent Document 1 for example).

As a reference index for indicating a level of an image quality of a CMOS solid-state image sensor, there is temporal flickering in a sensed image. The temporal flickering in an image is caused by temporal and random changes in a signal level detected from each pixel. As one of the reasons, for example, it has been known that, in a case where an RTS noise is generated in a MOS field-effect transistor used in the comparator composing an AD conversion unit, this causes remarkable flickering in a sensed image. To reduce this flickering in the image, it is needed to reduce the RTS noise generated in the MOS field-effect transistor, which is a cause of the noise.

To reduce the RTS noise generated in the MOS field-effect transistor, conventionally, there has been a method for composing the MOSFET, which may be a cause of the noise in the semiconductor integrated circuit, with a MOS field-effect transistor of an embedded channel type (see Patent Document 2, for example).

CITATION LIST

Patent Document

Patent Document 1: Japanese Patent Application Laid-Open No. 2013-90305
Patent Document 2: Japanese Patent Application Laid-Open No. 2015-46586

SUMMARY OF THE INVENTION

Problems to be Solved by the Invention

However, in the case of the conventional technique described in Patent Document 2, there may be a configuration that an embedded channel type MOS field-effect transistor is provided on a same semiconductor substrate together with a general surface mounted channel type MOS field-effect transistor. Accordingly, it is needed to add a manufacturing process to form an embedded channel type MOS field-effect transistor, and this causes an increase of a cost for manufacturing a semiconductor integrated circuit such as a CMOS solid-state image sensor.

In view of the above problem, the present disclosure has an object to provide a MOS field-effect transistor, a semiconductor integrated circuit and a solid-state image sensor which include the MOS field-effect transistor, and an electronic device including the solid-state image sensor that can reduce RTS noise without increasing the manufacturing cost.

Solutions to Problems

To achieve the above object, a MOS field-effect transistor according to the present disclosure includes:
an element isolation region that defines an active region;
a source region and a drain region formed in the active region;
a gate insulating film provided on a channel region between the source region and the drain region; and
a gate electrode provided on the gate insulating film, in which
the gate electrode has an electrode shape in which a potential at a border between the element isolation region and the active region becomes shallower than a potential at a channel center part.

To achieve the above object, a semiconductor integrated circuit according to the present disclosure includes a MOS field-effect transistor, and
the MOS field-effect transistor having the above configuration is used as the MOS field-effect transistor.

To achieve the above object, a solid-state image sensor according to the present disclosure includes
a pixel array unit having pixels including a photoelectric conversion element which are arranged in a matrix state, and
a circuit unit including a MOS field-effect transistor and configured to process a signal read from the pixels, and
a MOS field-effect transistor having the above described configuration is used as the MOS field-effect transistor.

To achieve the above object, an electronic device according to the present disclosure includes a solid-state image sensor as an imaging unit,
the solid-state image sensor includes
a pixel array unit having pixels including a photoelectric conversion element which are arranged in a matrix manner, and
a circuit unit including a MOS field-effect transistor and configured to process a signal read from the pixels, and
a MOS field-effect transistor having the above configuration is used as the MOS field-effect transistor.

In the MOS field-effect transistor, in a case where a potential at a border between an element isolation region and an active region becomes shallower than a potential at a channel center part, anon-state current (drain current) mainly flows in the channel center part and hardly flows near an edge area of the element isolation region. With this configuration, a carrier capture/emission of a trap, which exists in the edge area of the element isolation region and may cause an RTS noise, is unlikely to occur. Thus, without creating an embedded channel type MOS field-effect transistor, an occurrence of an RTS noise can be suppressed.

Effects of the Invention

According to the present disclosure, since the occurrence of an RTS noise can be suppressed without creating an embedded channel type MOS field-effect transistor, the RTS noise can be reduced without increasing the manufacturing cost.

It is noted that the effects of the present disclosure are not necessarily limited to the effects described here and may be any effect described in this specification. Further, the effects described in this specification are just examples and do not set any limitation, and there may be additional effects.

BRIEF DESCRIPTION OF DRAWINGS

FIG. 21 is a schematic plan view of a MOSFET according to a second illustrative example in which an electrode structure according to the seventh embodiment is applied to the electrode structure of the amplifying transistor.

MODE FOR CARRYING OUT THE INVENTION

Figure 1:
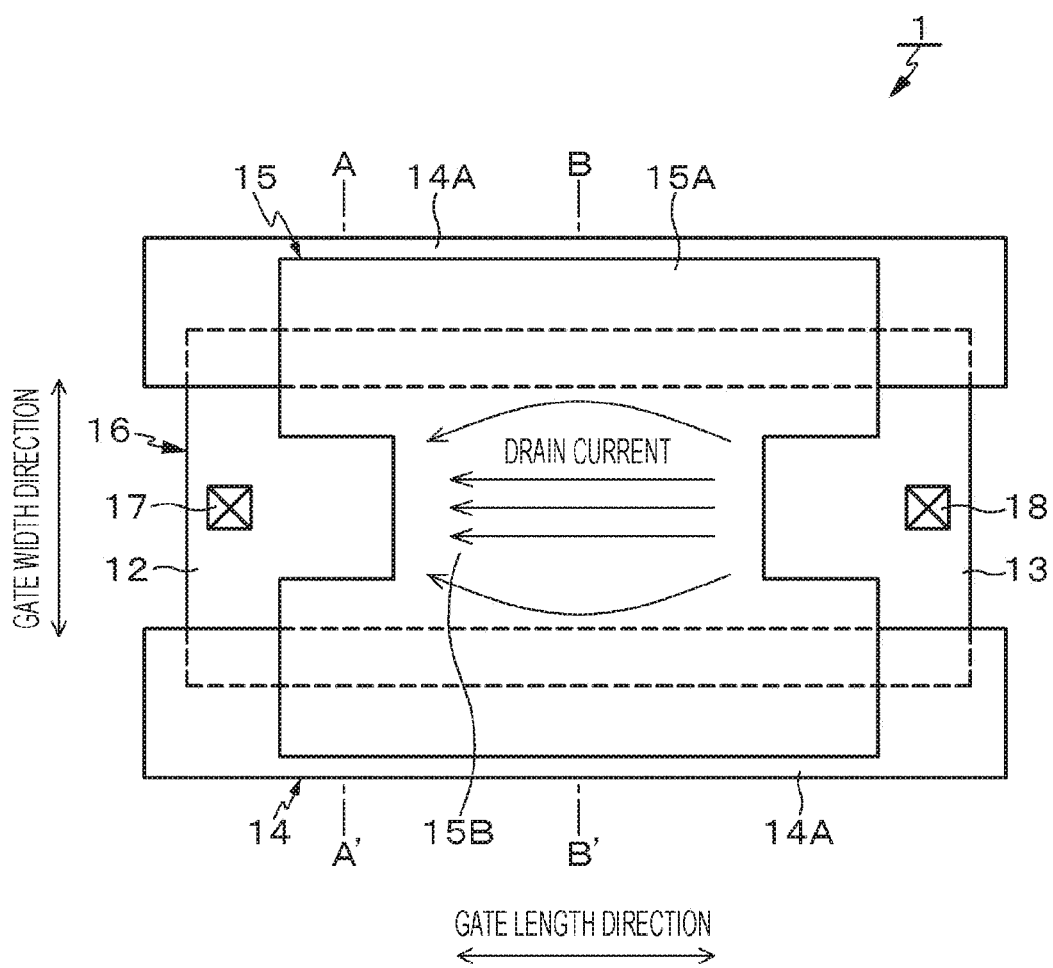
FIG. 1 is a schematic plan view of a MOSFET according to a first embodiment.

In the following, a mode to implement the technique according to this disclosure (hereinafter, referred to as an "embodiment") will be described in detail with reference to the drawings. The technique according to this disclosure is not limited to the embodiments and the various numbers or the like described in the embodiments are examples. In the following descriptions, same elements and elements having a same function are described with a same reference numeral and overlapping descriptions are omitted. Here, the descriptions are given in the following order.

1. General description of MOS field-effect transistor, semiconductor integrated circuit, solid-state image sensor, and electronic device according to the present disclosure
2. MOS field-effect transistor (MOSFET)
2-1. First embodiment (an example of an N-type MOSFET)
2-2. Second embodiment (a modification of the first embodiment)
2-3. Third embodiment (a modification of the first embodiment)
2-4. Fourth embodiment (a modification of the third embodiment)
2-5. Fifth embodiment (a modification of the third embodiment)
2-6. Sixth embodiment (a modification of the third and fourth embodiments)

2-7. Seventh embodiment (an example of a case of a gate electrode is in a shape having a rectangular planar view)
2-8. Eighth embodiment (an example of a P-type MOSFET)
3. Semiconductor integrated circuit
4. Solid-state image sensor (an example of a CMOS image sensor)
4-1. System configuration
4-2. Pixel configuration
4-3. First application example
4-4. Second application example
5. Electronic device (an example of an imaging device)
<General Description of MOS Field-Effect Transistor, Semiconductor Integrated Circuit, Solid-State Image Sensor, and Electronic Device According to the Present Disclosure>

In a MOS field-effect transistor (hereinafter, referred to as "MOSFET"), a semiconductor integrated circuit, a solid-state image sensor, and an electronic device according to the present disclosure, a gate electrode may be made so that its length in a gate length direction at a border part between an element isolation region and an active region is greater than its length in a gate length direction at a channel center part. Further, a gate insulating film may be made so that its film thickness at the border part between the element isolation region and active region is greater than its film thickness at the channel center part.

In the MOSFET, semiconductor integrated circuit, solid-state image sensor, and electronic device according to the present disclosure, which include the above described preferable configurations, the gate electrode may have a configuration including a first electrode region provided on the channel region in a center area of the active region and a second electrode region which is connected to the first electrode region and provided on a border between the element isolation region and active region. In this case, the second electrode region may be provided along the border between the element isolation region and active region in an edge area of the element isolation region in the gate length direction, except for an area facing to contact units of the source region and drain region, and covers a part of the element isolation region and a part of the active region. Further, a plurality of contact units may be provided to the source region and drain region respectively.

Further, in the MOSFET, semiconductor integrated circuit, solid-state image sensor, and electronic device according to the present disclosure, which include the above described preferable configuration, the second electrode region of the gate electrode may be provided on the border between the element isolation region and active region only in the side of the source region or only in the side of the drain region, and cover the element isolation region and a part of the active region. Further, the gate insulating film may be provided along the border between the element isolation region and active region placed in both edge areas in the channel width direction, and have two thick-film regions, which are thick film areas corresponding to a part of the element isolation region and a part of the active region. Further, the two thick-film regions may include a projecting region which projects in the channel center part side.

Further, in the MOSFET, semiconductor integrated circuit, solid-state image sensor, and electronic device according to the present disclosure, which include the above described preferable configuration, the gate electrode may have a rectangular electrode shape in a planar view. In this case, the gate insulating film may be provided along the border between the element isolation region and active region placed in both edge areas in the channel width direction, and include two thick-film regions which are thick film regions corresponding to a part of the element isolation region and a part of the active region and a connected region which is a thick film provided across the two thick-film regions in the channel center part.

Further, in the solid-state image sensor according to the present disclosure, which includes the above described preferable configuration, in a case where the circuit unit includes a signal processing unit having an AD converting device including a comparator for comparing a signal read from each pixel in the pixel array unit for every pixel column with a reference signal, the comparator may include the MOSFET according to the present disclosure, which is a MOSFET having a gate electrode in an electrode shape that a potential at a border between the element isolation region and active region becomes shallower than a potential at the channel center part. Further, the amplifying transistor, which composes a unit pixel and amplifies a signal based on a charge on which a photoelectric conversion is performed in the photoelectric conversion element, may include the MOSFET according to the present disclosure, which is a MOSFET having a gate electrode in an electrode shape in which a potential at a border between the element isolation region and active region becomes shallower than a potential at the channel center part.

<MOS Field-Effect Transistor>

First Embodiment

Figure 2A:
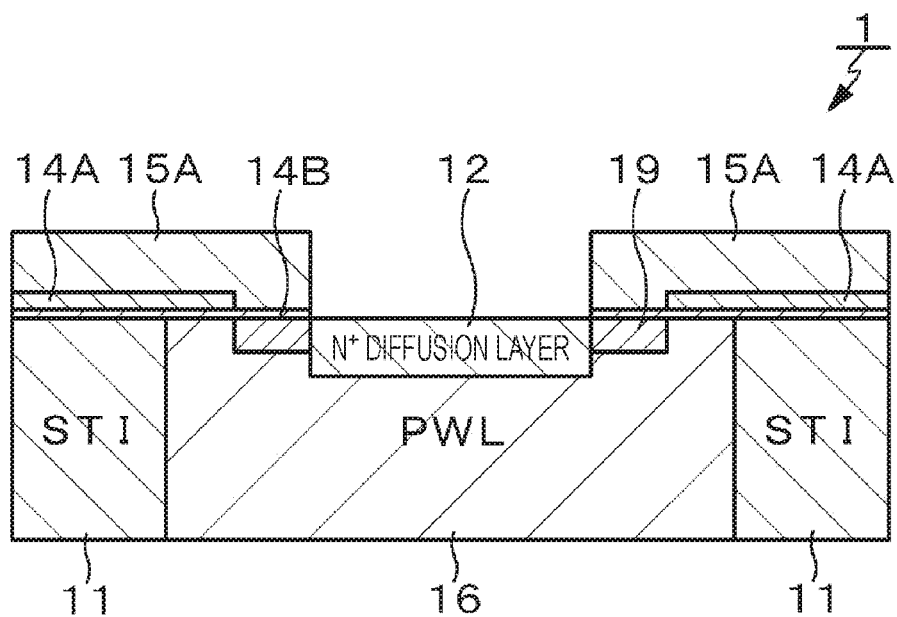
FIG. 2A is a sectional view taken along the line A-A' of FIG. 1.
Figure 2B:
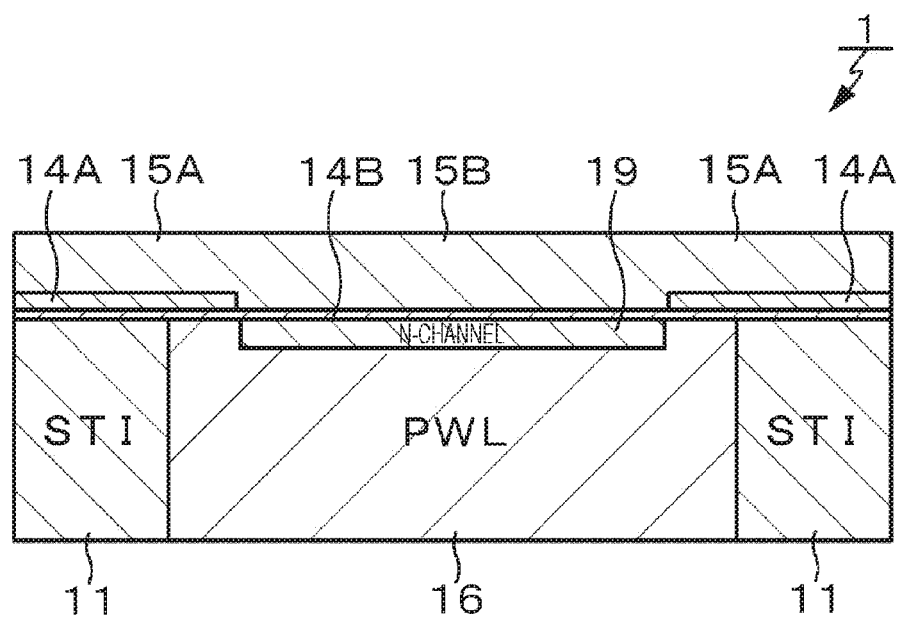
FIG. 2B is a sectional view taken along the line B-B' of FIG. 1.

According to a first embodiment, an example suitable to a case of an N-type MOSFET will be described. FIG. 1 illustrates a schematic plan view of a MOSFET according to the first embodiment. Further, FIG. 2A illustrates a sectional view taken along the line A-A' of FIG. 1, and FIG. 2B illustrates a sectional view taken along the line B-B' of FIG. 1.

A MOSFET 1 includes an element isolation region (shallow trench isolation: STI) 11, a source region 12, a drain region 13, a gate insulating film 14, and a gate electrode 15. The element isolation region 11 includes an insulating film embedded therein and defines an active region 16 in which a drain current flows and an impurity atom is added. The active region 16 includes a P-type well (PWL). Here, in FIG. 1, the element isolation region 11 is not illustrated. The source region 12 and drain region 13 includes an N+ diffusion layer on the active region 16 and are electrically connected to unillustrated lines (a source electrode and a drain electrode) via contact units 17 and 18.

The gate insulating film 14 is provided on a channel region 19 between the source region 12 and drain region 13, and includes a thick-film region 14A provided at a border part between the element isolation region 11 and active region 16 and a thin-film region 14B provided at a channel center part. In other words, in the gate insulating film 14, the thick film at the border part between the element isolation region 11 and active region 16 is greater than the thickness at the channel center part.

The gate electrode 15 includes an N-type electrode and provided on the gate insulating film 14. The gate electrode 15 has a planar shape that is symmetric in a gate length direction and a gate width direction. Then, as illustrated in FIG. 1, the gate electrode 15 has an electrode structure in which the length in the gate length direction is discontinuous with respect to the length in the gate width direction, that is, the length at the border part between the element isolation region 11 and active region 16 in the gate length direction is longer than the length at the channel center part in the gate length direction. More specifically, the gate electrode 15 includes an electrode region 15A which is longer in the gate length direction and an electrode region 15B which is shorter in the gate length direction.

Figure 3A:
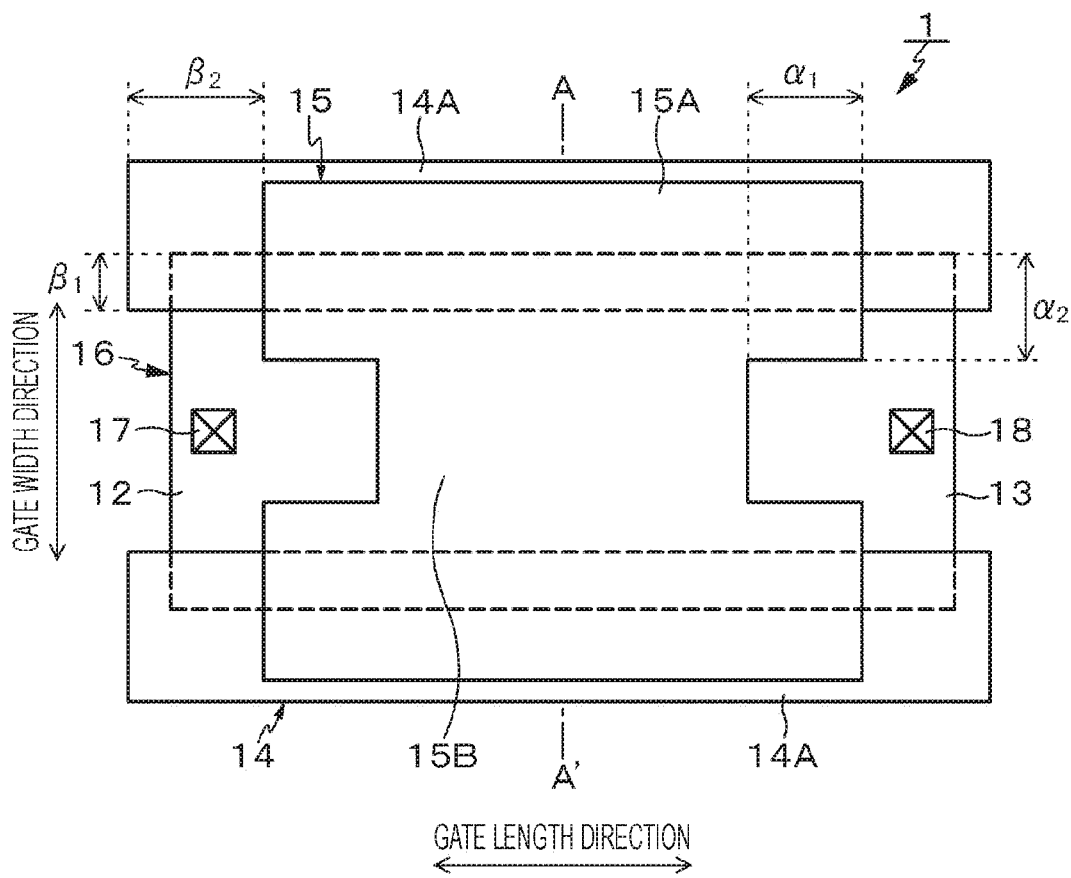
FIG. 3A is a diagram illustrating an example of dimensions of each part in a planar shape of the MOSFET according to the first embodiment.
Figure 3B:
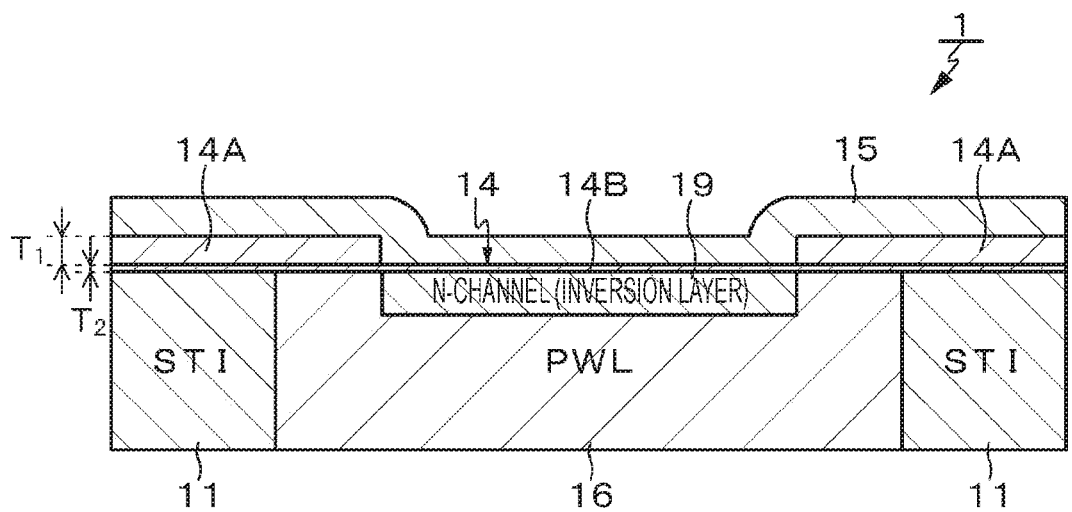
FIG. 3B is a diagram illustrating an example of dimensions of each part in a cross-section shape of the MOSFET according to the first embodiment.

Here, examples of the dimensions of each part in the MOSFET 1 having the above described configuration will be described with reference to FIGS. 3A and 3B. FIG. 3A is a diagram illustrating examples of dimensions of each unit in the planar shape of the MOSFET according to the first embodiment, and FIG. 3B is a diagram illustrating examples of dimensions of each part in a cross-section shape of the MOSFET according to the first embodiment.

In the gate electrode 15, in a case where a dimensional difference between the electrode region 15A, which is longer in the gate length direction, and the electrode region 15B, which is shorter in the gate length direction, is assumed as $\alpha_1$ and the dimension between an inner side of the longer electrode region 15A and an outer side of the active region 16 is assumed as $\alpha_2$, it is preferable that $\alpha_1$ and $\alpha_2$ are both equal to or greater than 0.05 [um]. Further, in the gate insulating film 14, in a case where a dimension between an inner side of the thick-film region 14A and an outer side of the active region 16 is assumed as $\beta_1$ and the dimension between an edge of the thick-film region 14A and an edge of the longer electrode region 15A of the gate electrode 15 is assumed as $\beta_2$, it is preferable that $\beta_1$ and $\beta_2$ are both equal to or greater than 0.05 [um]. Further, in a case where the film thickness of the thick-film region 14A of the gate insulating film 14 at the border part between the element isolation region 11 and active region 16 is assumed as $T_1$ and the film thickness of the thin-film region 14B at the channel center part is assumed as $T_2$, it is preferable that $T_1-T_2$ is equal to or greater than 1 [nm].

Figure 4A:
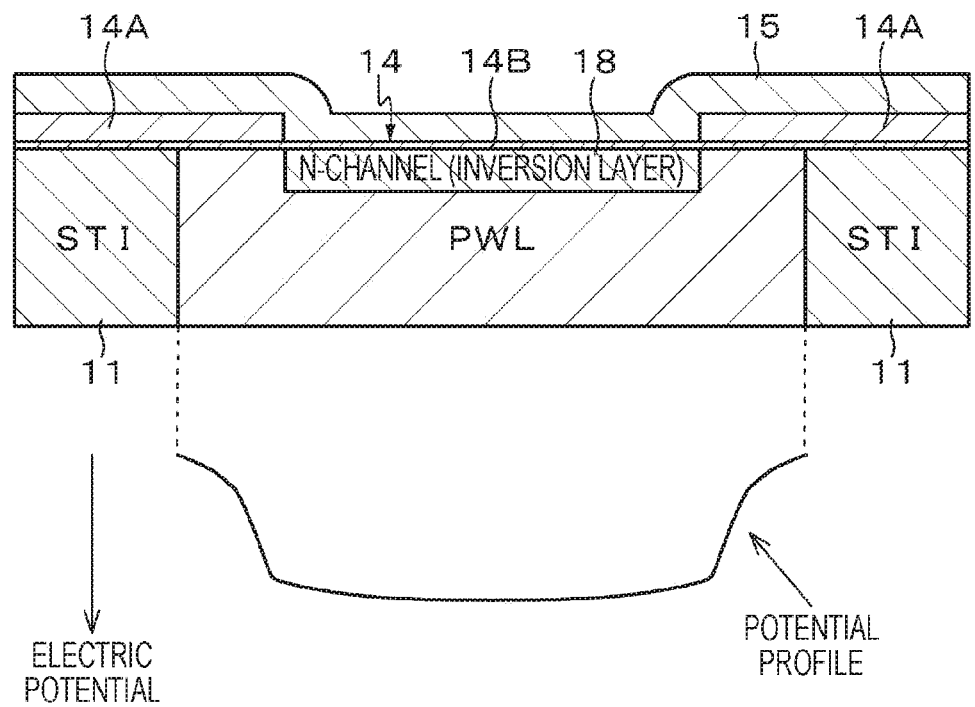
FIG. 4A is a schematic sectional view illustrating a potential profile of a channel in a case that the MOSFET is in an ON state in an electrode structure according to the first embodiment.

As described above, the MOSFET 1 according to the first embodiment has an electrode structure that its length in the gate length direction at the border part of the gate electrode 15 between the element isolation region 11 and active region 16 is greater than its length at the gate length direction at the channel center part. Further, the film thickness of the gate insulating film 14 at the border part between the element isolation region 11 and active region 16 is greater than the film thickness at the channel center part. FIG. 4A is a schematic sectional view illustrating a potential profile of a channel of a case that the MOSFET 1 is being turned on (the channel is in an inversion condition) in the electrode structure according to the first embodiment.

As illustrated in FIG. 4A, in the electrode structure according to the first embodiment, a threshold voltage becomes higher and the potential becomes shallower near the edge part of the element isolation region 11 and the potential becomes deeper at the channel center part. In other words, the electrode structure according to the first embodiment is an electrode structure in which the gate electrode 15 has an electrode shape that the potential at the border part between the element isolation region 11 and active region 16 becomes shallower than the potential at the channel center part.

In this manner, in a case where the potential at the border part between the element isolation region 11 and active region 16 is shallower than the potential at the channel center part, on-state current (drain current) of the MOSFET 1 mainly flows in the channel center part and hardly flows near the edge area of the element isolation region 11. In other words, a drain current density is concentrated in the channel center part, which is the electrode region 15B having a length shorter in the gate length direction of the gate electrode 15. With this configuration, a carrier capture/emission of a trap, which exits in the edge area of the element isolation region 11 and causes an RTS noise, is unlikely to occur and, since an occurrence of the RTS noise can be suppressed, the RTS noise can be reduced.

Figure 4B:
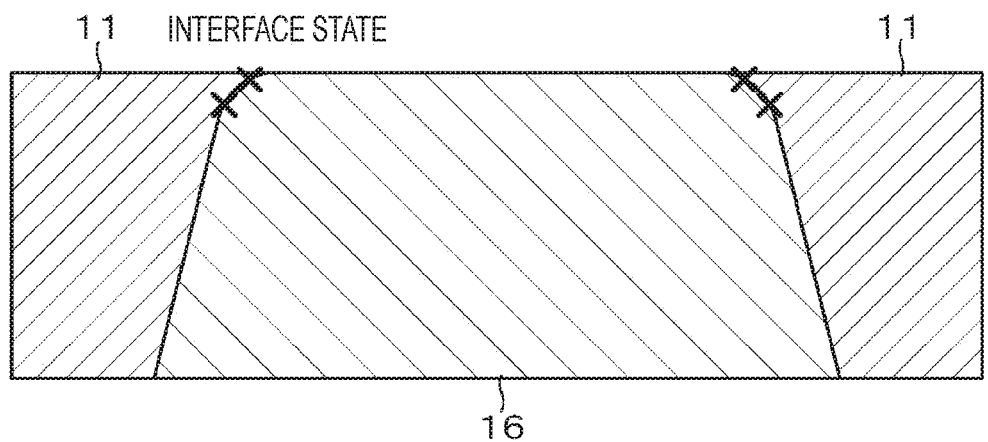
FIG. 4B is a diagram for explaining an interface state of a MOSFET which does not have the electrode structure according to the first embodiment.

In addition, in the MOSFET that does not have the electrode structure according to the first embodiment, as illustrated in FIG. 4B, an interface state that temporally captures and emits a carrier which causes an RTS noise is mainly on a silicon surface near the border between the element isolation region 11 and active region 16.

Second Embodiment

Figure 5A:
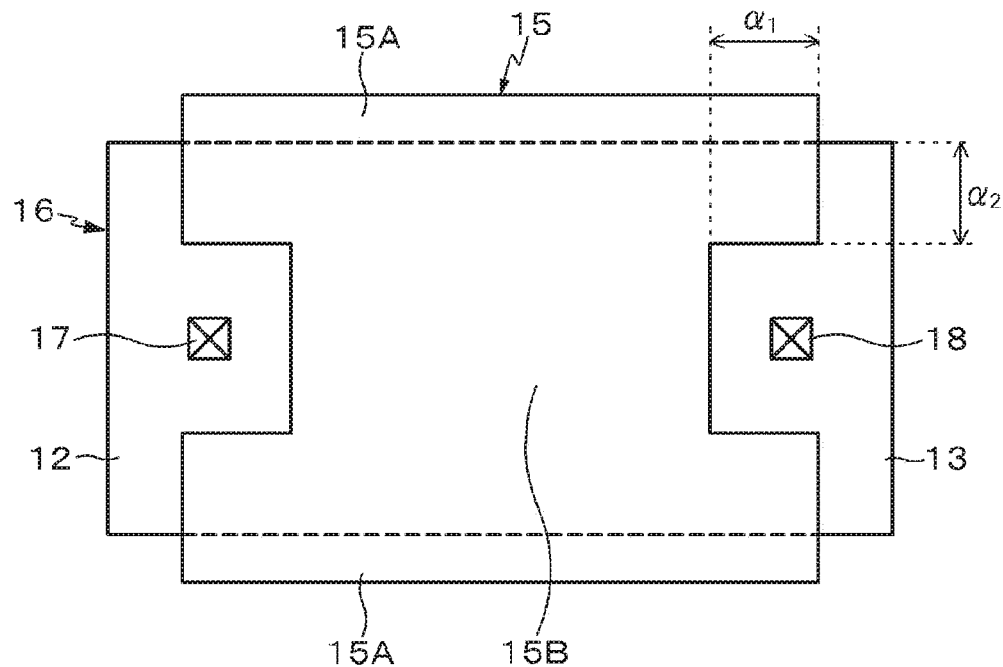
FIG. 5A is a schematic plan view of a MOSFET (No. 1) according to a second embodiment.

A second embodiment is a modification of the first embodiment. According to the second embodiment, the film thickness of the gate insulating film 14 is the same as in the border part between the element isolation region 11 and active region 16 and in the channel center part. FIG. 5A is a schematic plan view illustrating a MOSFET (No. 1) according to the second embodiment, and FIG. 5B is a schematic plan view illustrating a MOSFET (No. 2) according to the second embodiment.

The gate electrode 15 according to the second embodiment has a planar shape that is symmetric in the gate length direction and gate width direction. Here, the gate electrode 15 according to the second embodiment is same as that of the first embodiment in that the length in the gate length direction at the border part between the element isolation region 11 and active region 16 is greater than the length in the gate length direction at the channel center part, that is an electrode structure in which the length in the gate length direction is discontinuous in the gate width direction.

In the MOSFET (No. 1) illustrated in FIG. 5A according to the second embodiment, an edge part of the longer electrode region 15A of the gate electrode 15 is in a rectangular shape as in the first embodiment. In the gate electrode 15, in a case where a difference between the length of the longer electrode region 15A in the gate length direction and the length of the shorter electrode region 15B is assumed as $\alpha_1$ and the dimension between an inner side of the longer electrode region 15A and an outer side of the active region 16 is assumed as $\alpha_2$, it is preferable that $\alpha_1$ and $\alpha_2$ are both equal to or greater than 0.05 [um].

Figure 5B:
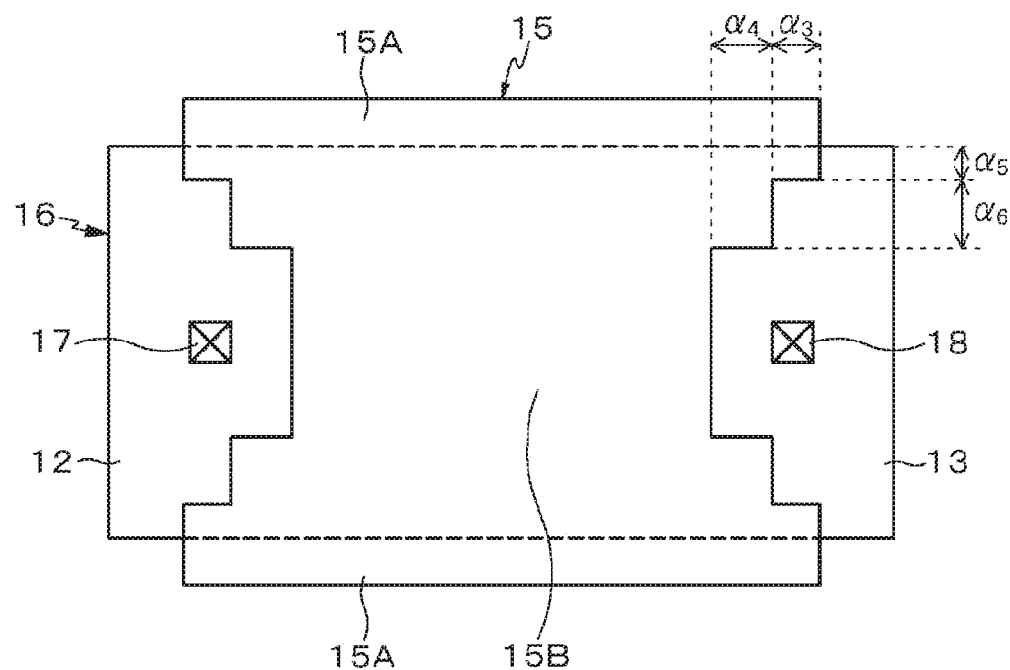
FIG. 5B is a schematic plan view of a MOSFET (No. 2) according to the second embodiment.

In the MOSFET (No. 2) illustrated in FIG. 5B according to the second embodiment, the edge part of the longer electrode region 15A of the gate electrode 15 is formed in a step-like shape including two steps for example. In the step-like part of the gate electrode 15, in a case where a height of the first step is assumed as $\alpha_3$ and a height of the second step is assumed as $\alpha_4$, it is preferable that $\alpha_3$ and $\alpha_4$ are both equal to or greater than 0.05 [um]. Further, in a case where the dimension between the outer side of the active region 16 and the inner face of the first step is assumed as $\alpha_5$ and the dimension between the inner face of the first step and the inner face of the second step is assumed as $\alpha_6$, it is preferable that $\alpha_5$ and $\alpha_6$ are both equal to or greater than 0.05 [um].

In the above described MOSFET 1 according to the second embodiment, while the film thickness of the gate insulating film 14 is overall the same, in the electrode structure, the length in the gate length direction at the border part of the gate electrode 15 between the element isolation region 11 and active region 16 is greater than the length in the gate length direction at the channel center part. In this electrode structure according to the second embodiment, the potential at the channel center part becomes deeper than the potential at the border part between the element isolation region 11 and active region 16 and the drain current density is concentrated in the channel center part. Since this configuration can prevent RTS noise from occurring, the RTS noise can be reduced.

Third Embodiment

Figure 6A:
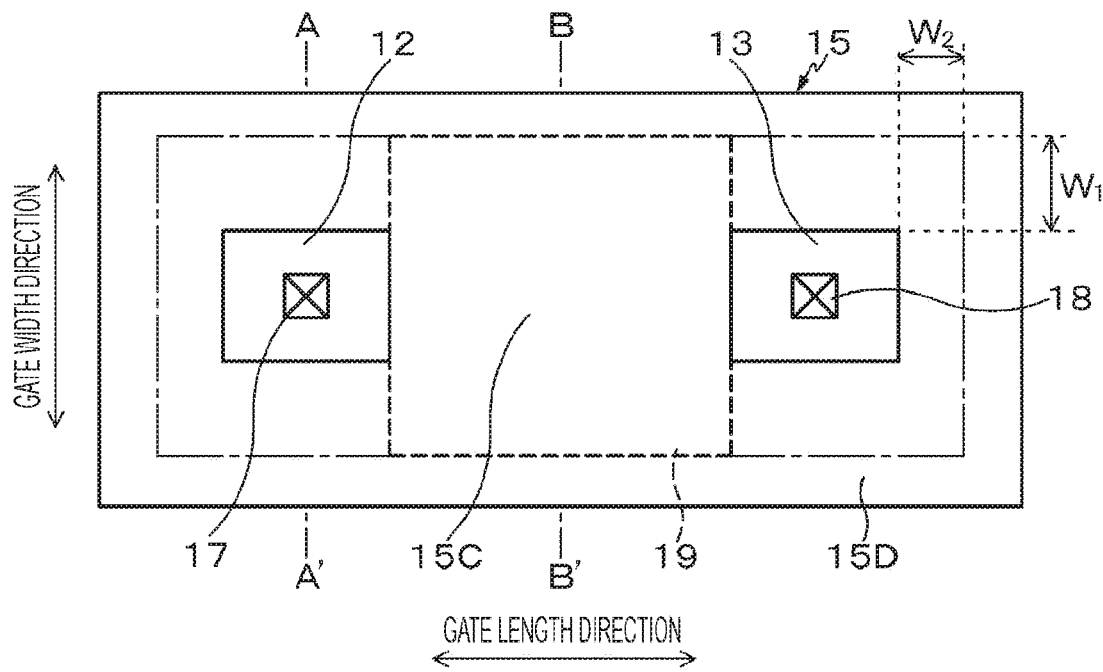
FIG. 6A is a schematic plan view of the MOSFET according to a third embodiment.
Figure 6B:
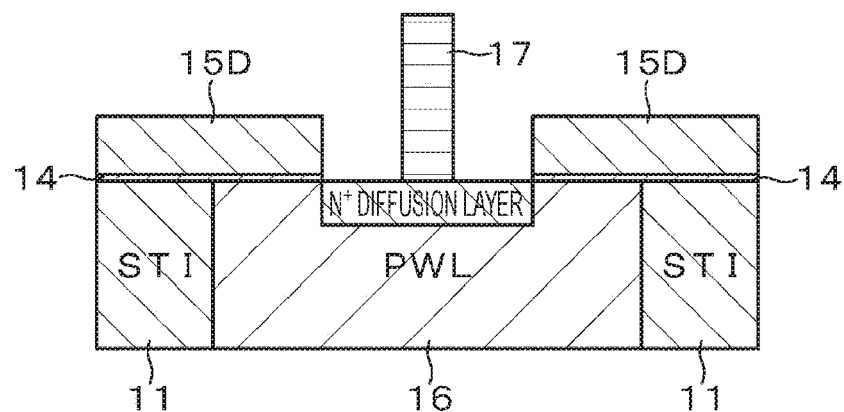
FIG. 6B is a sectional view taken along the line A-A' of FIG. 6A.
Figure 6C:
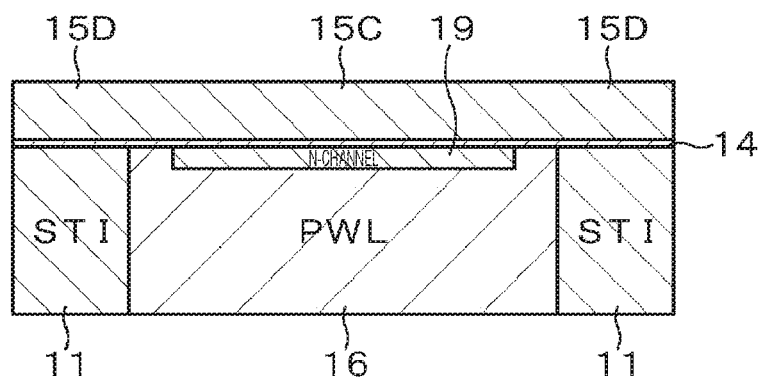
FIG. 6C is a sectional view taken along the line B-B' of FIG. 6A.

A third embodiment is a modification of the first embodiment. The electrode structure according to the third embodiment is a structure in which an area of the gate electrode 15 is wider than that of the electrode structure according to the first embodiment. FIG. 6A illustrates a schematic plan view of a MOSFET according to the third embodiment, FIG. 6B illustrates a sectional view taken along the line A-A' in FIG. 6A, and FIG. 6C illustrates a sectional view taken along the line B-B' in FIG. 6A.

As illustrated in FIG. 6A, the gate electrode 15 has a planar shape that is symmetric in the gate length direction and gate width direction. Here, the gate electrode 15 is placed on the channel region 19 at a center part of the active region 16, and includes a first electrode region 15C that separates the source region 12 from the drain region 13 and a second electrode region 15D which is connected to (integrated with) the first electrode region 15C and placed on all borders between the element isolation region 11 and active region 16. In FIG. 6A, the border between the element isolation region 11 and active region 16 is illustrated with dashed-dotted lines.

The first electrode region 15C of the gate electrode 15 corresponds to the electrode region 15B of the gate electrode 15 according to the first embodiment. The second electrode region 15D of the gate electrode 15 is provided to cover a part of the element isolation region 11 and a part of the active region 16. Here, in FIG. 6A, in a case where the covering width of the gate electrode 15 from the border between the element isolation region 11 and active region 16 in the gate width direction is assumed as $W_1$ and the covering width in the gate length direction is assumed as $W_2$, it is preferable that $W_1$ and $W_2$ are both equal to or greater than 0.05 [um].

Also in the electrode structure according to the third embodiment, as in the electrode structure according to the first embodiment, in a case where the MOSFET 1 is in an ON state, there provided is a potential profile in which the potential at the border part between the element isolation region 11 and active region 16 becomes shallower than the potential at the channel center part. With this configuration, since the drain current density is concentrated in the channel center part, an occurrence of an RTS noise caused by a trap in the edge part of the active region 16 is prevented.

Further, in the electrode structure according to the third embodiment, an active electrode area of the gate electrode 15 is made wider. Here, an amplitude of the RTS noise is in inverse proportion to the size of a gate area of the MOSFET. Thus, in a case where the active electrode area of the gate electrode 15 is made wider, the amplitude of the RTS noise generated in the channel center part can be reduced, and noise power of the RTS noise can be reduced. In addition, since the area of the N+ diffusion layer which forms the source region 12 and drain region 13 is reduced, this is effective to reduce a junction leakage current and a junction capacitance between the N+ diffusion layer and the active region (well) 16.

Fourth Embodiment

Figure 7A:
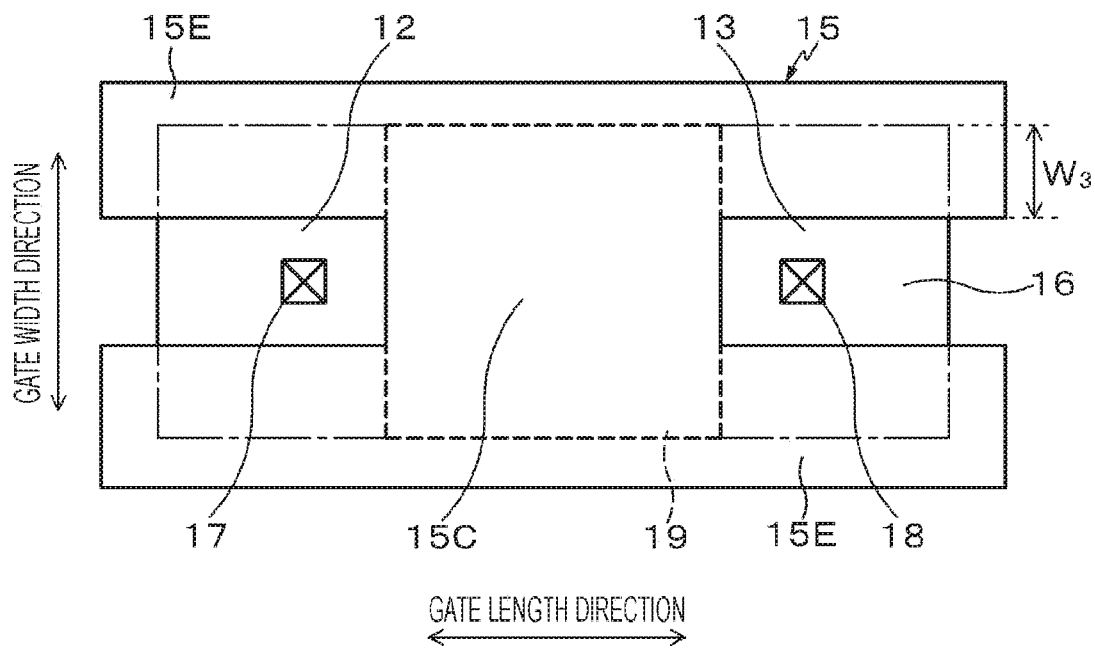
FIG. 7A is a schematic plan view of the MOSFET according to a fourth embodiment.

A fourth embodiment is a modification of the third embodiment. Compared to the electrode structure according to the third embodiment, an electrode structure according to the fourth embodiment has a configuration in which a capacity between the gate electrode 15 and contact units 17 and 18 is reduced. FIG. 7A illustrates a schematic plan view of a MOSFET according to the third embodiment.

As illustrated in FIG. 7A, the gate electrode 15 has a planar shape that is symmetric in the gate length direction and gate width direction. Then, the gate electrode 15 includes an electrode region 15C and an electrode region 15E which is connected to (integrated with) the electrode region 15C. As in the case of the second embodiment, the electrode region 15C is placed on the channel region 19 in the center part of the active region 16 and separates the source region 12 from the drain region 13. The electrode region 15E, which corresponds to the second electrode region 15D, is placed on the border between the element isolation region 11 and active region 16 except for a part facing to the contact units 17 and 18 at the edge parts of the element isolation region 11 in the gate length direction, so as to cover a part of the element isolation region 11 and a part of the active region 16.

The electrode region 15C of the gate electrode 15 has a configuration which is same as that of the electrode region 15C of the gate electrode 15 according to the first embodiment. The electrode region 15E of the gate electrode 15 has a configuration in which the parts facing to the contact units 17 and 18 are removed, at the edge part of the element isolation region 11 in the gate length direction, from the electrode region 15D of the gate electrode 15 according to the first embodiment. Here, in a case where a covering width of the gate electrode 15 from the border between the element isolation region 11 and active region 16 in the gate width direction is assumed as $W_3$, it is preferable that $W_3$ is equal to or greater than 0.05 [um].

Figure 7B:
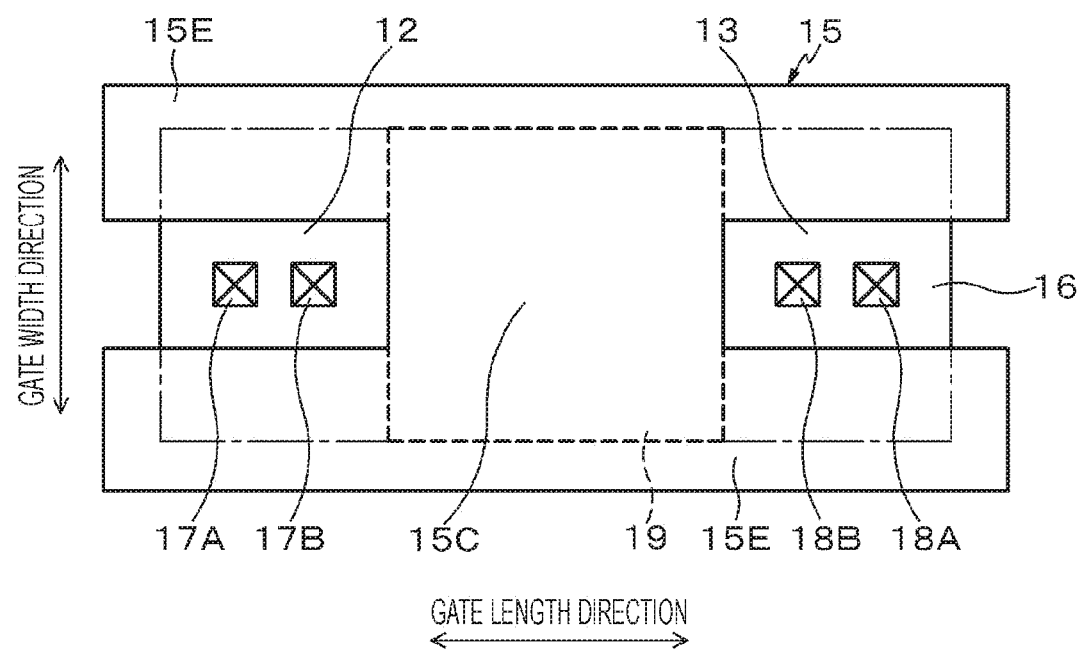
FIG. 7B is a schematic plan view illustrating an example in which two contact units are provided to a source region and a drain region respectively.

With the electrode structure according to the fourth embodiment, a following effect can be obtained in addition to the effect similar as that of the electrode structure according to the second embodiment, that is, an effect that the potential at the channel center part is made deeper. In other words, in the electrode structure according to the third embodiment, since the gate electrode 15 has an electrode shape in which an electrode does not exist at a part facing to the contact units 17 and 18 at an edge parts of the element isolation region 11 in the gate length direction, the capacitance between the gate electrode 15 and contact units 17 and 18 can be reduced, compared to the electrode structure according to the second embodiment. With this configuration, since a plurality of contact units can be placed in the source region 12 and drain region 13 respectively, this provides both effects of a reduction of a contact resistance and an improvement of production yield related to an unpreferable power distribution. FIG. 7B illustrates an example in which two contact units 17A and 17B are provided in the source region 12 and two contact units 18A and 18B are provided in the drain region 13.

Fifth Embodiment

Figure 8A:
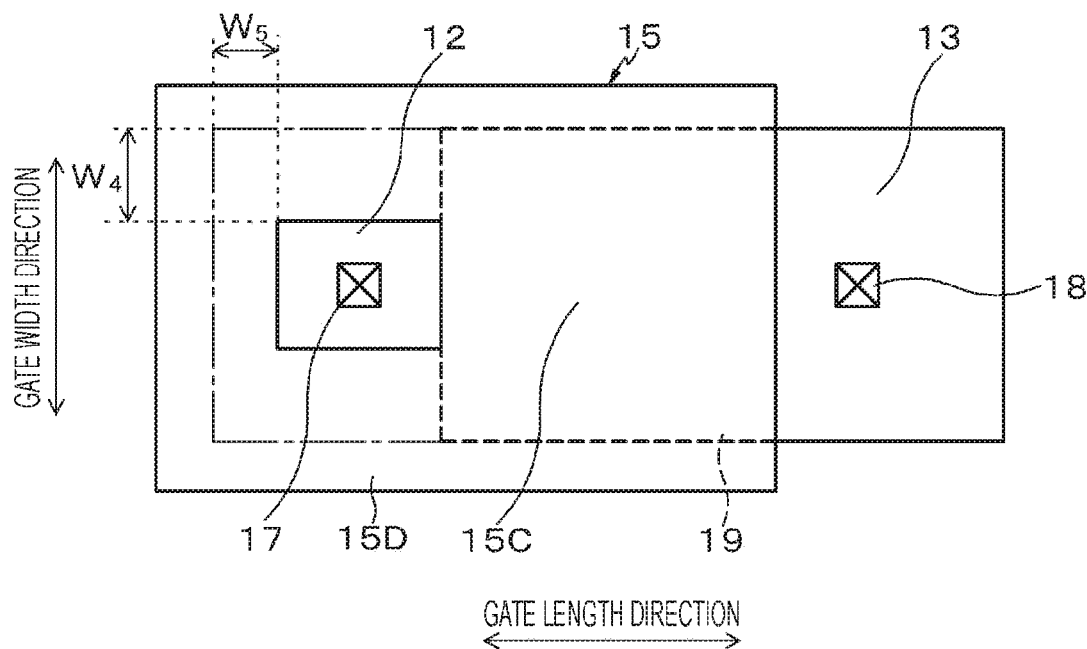
FIG. 8A is a schematic plan view of a MOSFET (No. 1) according to a fifth embodiment.

A fifth embodiment is a modification of the third embodiment. FIG. 8A illustrates a schematic plan view of a MOSFET (No. 1) according to the fifth embodiment, and FIG. 8B illustrates a schematic plan view of a MOSFET (No. 2) according to the fifth embodiment.

Figure 8B:
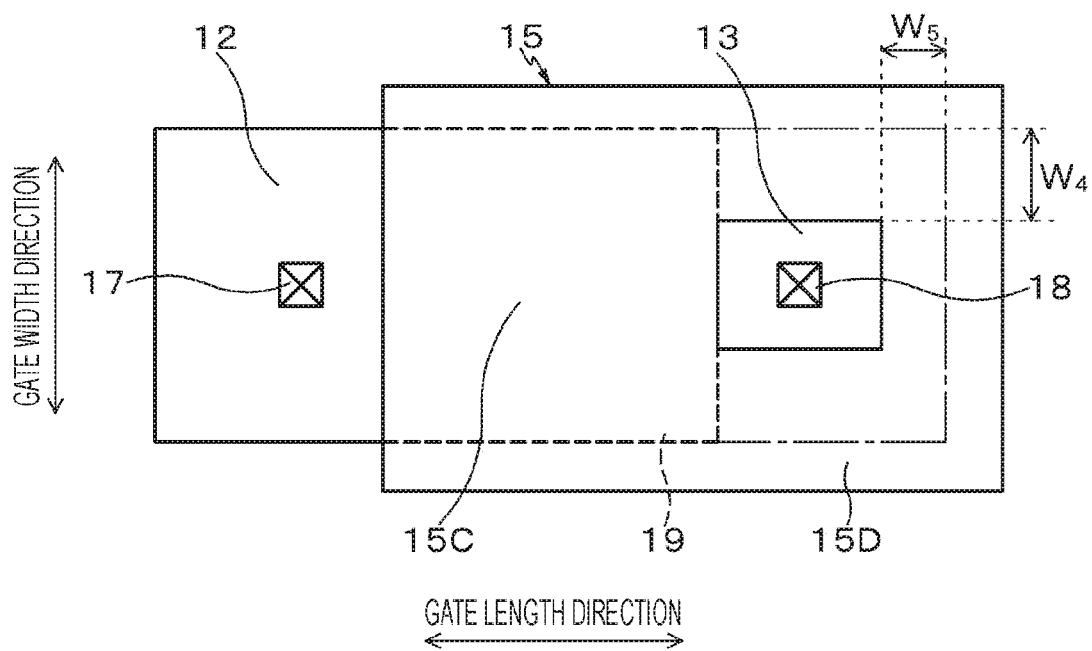
FIG. 8B is a schematic plan view of a MOSFET (No. 2) according to the fifth embodiment.

As illustrated in FIGS. 8A and 8B, the gate electrode 15 has a planar shape that is symmetric in the gate length direction and gate width direction. Here, the gate electrode 15 includes an electrode region 15C and an electrode region 15D which is connected to (integrated with) the electrode region 15C. As in the case of the second embodiment, the electrode region 15C is provided on the channel region 19 in the center part of the active region 16 and separates the source region 12 from the drain region 13.

The electrode region 15D is provided on the border between the element isolation region 11 and active region 16 to cover a part of the element isolation region 11 and a part of the active region 16, only in the side of the source region 12 (in a case of FIG. 8A) or only in aside of the drain region 13 (in a case of FIG. 8B). FIGS. 8A and 8B illustrate the border between the element isolation region 11 and active region 16 with dashed-dotted lines. Here, in FIGS. 8A and 8B, in a case where a covering width of the gate electrode 15 from the border between the element isolation region 11 and active region 16 in the gate width direction is assumed as $W_4$ and a covering width in the gate length direction is assumed as $W_5$, it is preferable that $W_4$ and $W_5$ are both equal to or greater than 0.05 [um].

The electrode structure according to the fifth embodiment has an effect similar as the effect of the electrode structure according to the third embodiment, that is, an effect that an occurrence of an RTS noise caused by a trap in the edge part of the active region 16 is suppressed by concentrating the drain current density to the channel center part. Further, in the electrode structure according to the fifth embodiment, for example, in a case of FIG. 8A, the gate electrode 15 is provided in a ring shape around the active region 16 in the side of the source region 12. With this electrode structure, there is an effect that a gate-drain capacitance $C_{gd}$ can be reduced, compared to the electrode structure according to the third embodiment and the electrode structure according to the fourth embodiment. With this configuration, in a case where the MOSFET of the electrode structure according to the fifth embodiment is used in a source ground circuit for example, since a mirror effect generated by a feedback action by a gate-drain capacitance $C_{gd}$ can be reduced, this can provide both a noise reduction and a mirror effect reduction.

Sixth Embodiment

Figure 9A:
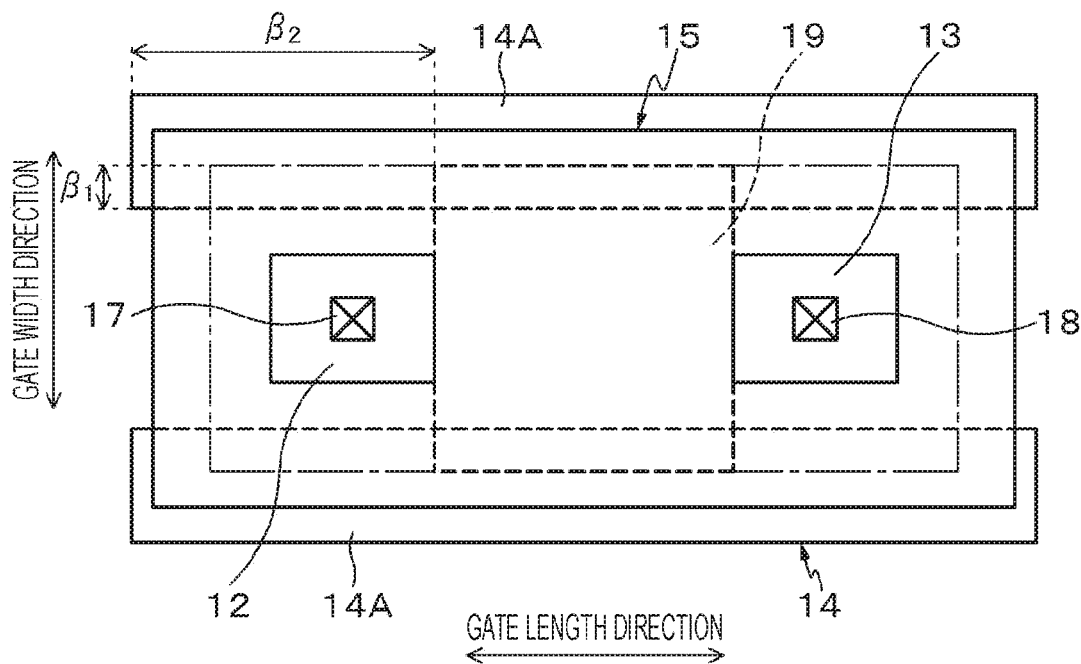
FIG. 9A is a schematic plan view of a MOSFET (No. 1) according to a sixth embodiment.
Figure 9B:
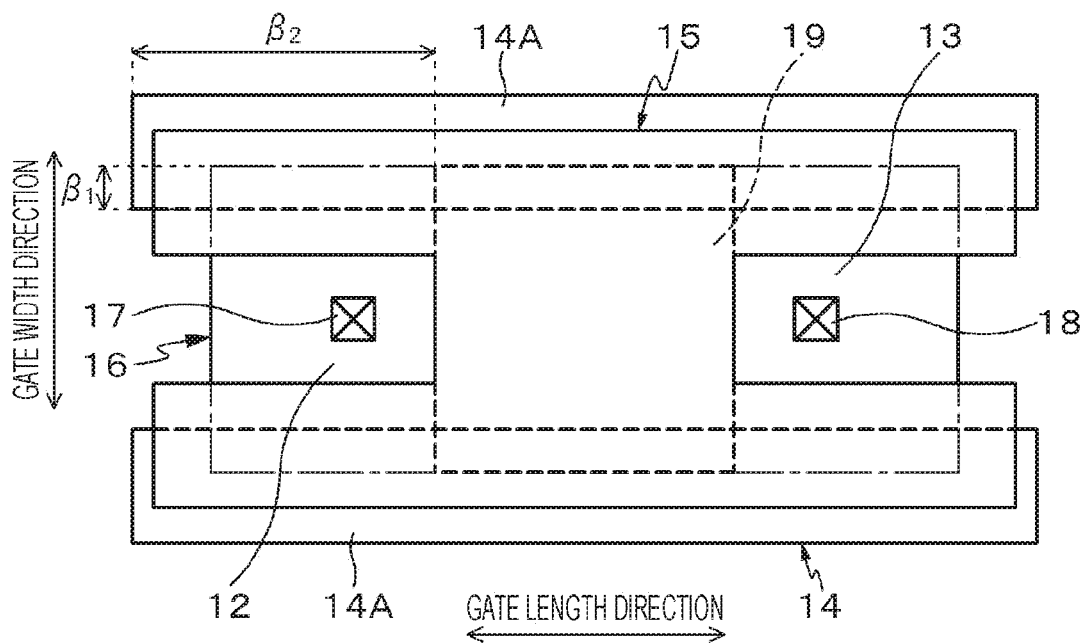
FIG. 9B is a schematic plan view of a MOSFET (No. 2) according to the fifth embodiment.

A sixth embodiment is a modification of the third and fourth embodiments. FIG. 9A illustrates a schematic plan view of a MOSFET (No. 1) according to the sixth embodiment, and FIG. 9B illustrates a schematic plan view of a MOSFET (No. 2) according to the sixth embodiment. The MOSFET (No. 1) according to the sixth embodiment illustrated in FIG. 9A is a modification of the third embodiment illustrated in FIG. 6A and the MOSFET (No. 2) according to the fifth embodiment illustrated in FIG. 9B is a modification of the fourth embodiment illustrated in FIG. 7A.

As illustrated in FIG. 9A, the electrode structure of the MOSFET (No. 1) according to the sixth embodiment includes a gate insulating film 14 having two thick-film regions 14A and 14A which are thick films in the regions corresponding to a part of the element isolation region 11 and a part of the active region 16 and are provided on the border (illustrated with dashed-dotted lines) between the element isolation region 11 and active region 16 placed in both edge areas in a channel width direction, as illustrated in in the electrode structure according to the third embodiment in FIG. 6A. The film thickness of the thick-film regions 14A and 14A of the gate insulating film 14 is greater than the film thickness of the thin-film region at the channel center part (corresponding to the thin-film region 14B in FIG. 2B). The thick-film region 14A, which is made as a thick film, has a planar shape that is symmetric in the gate length direction and gate width direction.

Here, in the channel width direction, when a dimension between an inner side of the thick-film region 14A and the border (illustrated with the dashed-dotted lines) between the element isolation region 11 and active region 16 is assumed as $\beta_1$ and a dimension from an edge face of the thick-film region 14A to an edge face of the channel region 19 in a channel length direction is assumed as $\beta_2$, it is preferable that $\beta_1$ and $\beta_2$ are both equal to or greater than 0.05 [um].

As illustrated in FIG. 9B, the electrode structure of the MOSFET (No. 2) according to the sixth embodiment includes a gate insulating film 14 having a thick-film region 14A in a similar configuration as that of the MOSFET (No. 1), as illustrated in the electrode structure according to the third embodiment in FIG. 7A. Further, the dimensions $\beta_1$ and $\beta_2$ are same as those of the MOSFET (No. 1).

With the electrode structure according to the sixth embodiment, a following effect will be obtained in addition to a similar effect as that of the electrode structure according to the third embodiment, that is, an effect that the potential at the channel center part is made deeper. In other words, in the electrode structure according to the sixth embodiment, since the gate insulating film 14 in an edge area in the channel width direction of the element isolation region 11 is made as a thick film (thick-film region 14A), the threshold voltage of the active region 16 in the edge part in the channel width direction of the element isolation region 11 becomes higher. With this configuration, since the potential of the active region 16 at the edge part of the element isolation region 11 becomes shallower, and the drain current that flows in the edge part of the element isolation region 11 can be reduced, an occurrence of an RTS noise can be suppressed.

Figure 10A:
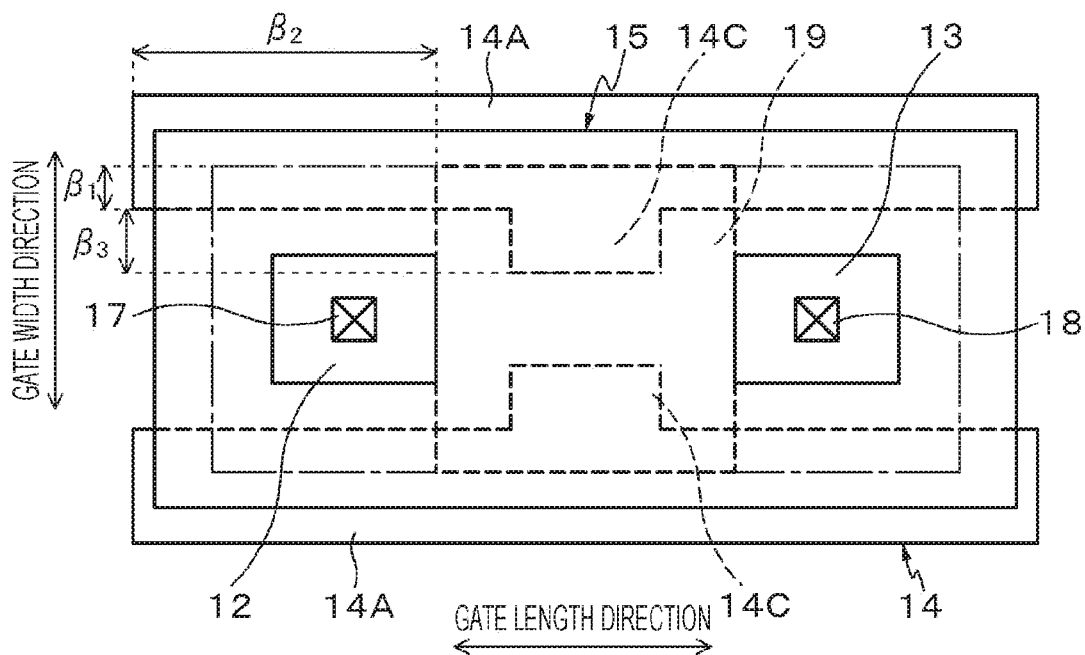
FIG. 10A is a schematic plan view of a modification of the MOSFET (No. 1) according to the sixth embodiment.

FIG. 10A illustrates a schematic plan view of a modification of the MOSFET (No. 1) according to the sixth embodiment. The electrode structure according to the present embodiment has a configuration in which the thick-film regions 14A and 14A provided in both sides of the gate insulating film 14 in the channel width direction have projecting regions 14C and 14C projected in the side of the channel center part in the electrode structure of the MOSFET (No. 1) according to the fifth embodiment. It is preferable that a projecting amount $\beta_3$ of the projecting regions 14C and 14C is equal to or greater than 0.05 [um] same as $\beta_1$ and $\beta_2$.

With the configuration of the gate insulating film 14 according to the sixth embodiment having the thick-film regions 14A and 14A and projecting regions 14C and 14C, the drain current that flows in the side of the edge part of the element isolation region 11 can be reduced. In other words, the drain current density can be further concentrated in the channel center part. With this configuration, an occurrence of an RTS noise can be suppressed and the RTS noise can be further reduced.

Seventh Embodiment

Figure 10B:
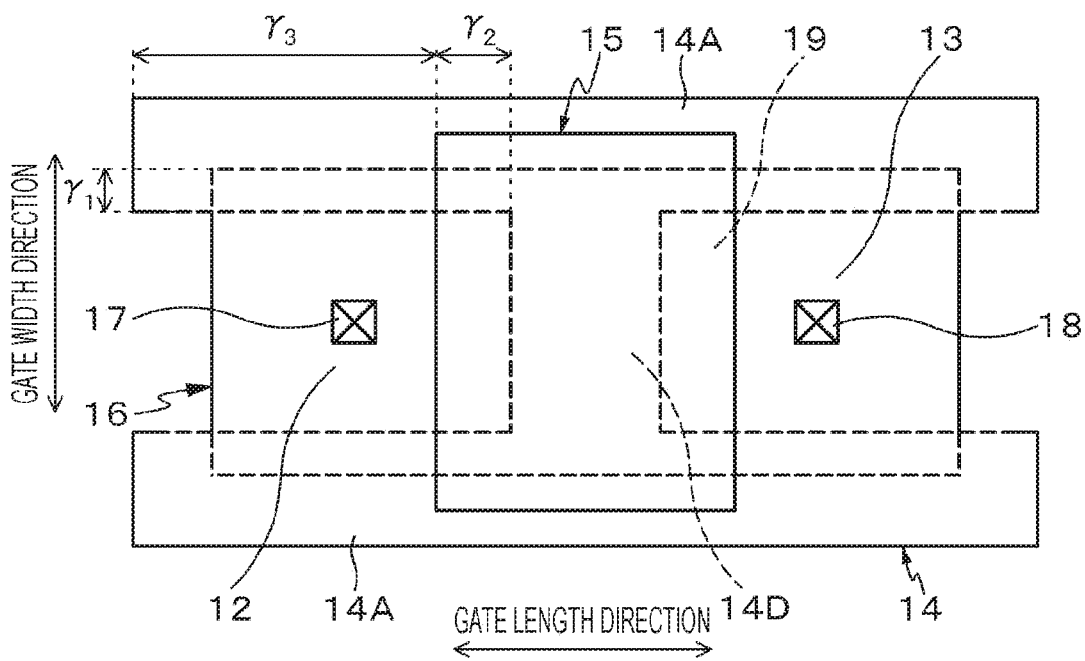
FIG. 10B is a schematic plan view of a MOSFET according to a seventh embodiment.

A seventh embodiment is an example that the gate electrode 15 is in a rectangular shape in a planar view. FIG. 10B illustrates a schematic plan view of a MOSFET according to the seventh embodiment.

As illustrated in FIG. 10B, the gate electrode 15 is in a rectangular electrode shape in a planar view (the planar shape is rectangular) as in a general MOSFET. Further, as in the case of the fifth embodiment, the gate insulating film 14 is made to include a connected region 14D including a thick film connecting the thick-film regions 14A and 14A in the channel center part, in addition to the thick-film regions 14A and 14A provided in both sides of the channel width direction. In other words, the gate insulating film 14 has a configuration that the thick-film regions 14A and 14A are provided on borders between the element isolation region 11 and active region 16 in the channel width direction, and a connected region 14D formed as a thick film is provided in the channel center part. In other words, in the gate insulating film 14 has a configuration in which the thick-film regions (14A, 14A, and 14D) formed in an H form in a planar view in the channel length direction on the active region 16 and has a planar shape that is symmetric in the channel length direction and channel width direction.

Here, in the channel width direction, the dimension from the inner side of the thick-film region 14A to the border between the element isolation region 11 and active region 16 is assumed as $\gamma_1$. Further, in a case where, in the channel length direction, a dimension from an edge face of the thick-film region 14A to an edge face of the gate electrode 15 is assumed as $\gamma_2$ and a dimension from an edge face of the gate electrode 15 to an edge ace of the connected region 14D is assumed as $\gamma_3$, it is preferable that $\gamma_1$, $\gamma_2$, and $\gamma_3$ are all equal to or greater than 0.05 [um].

With the electrode structure according to the seventh embodiment, since the gate insulating film 14 is made as a thick film in the edge part of the element isolation region 11 and this results in that the threshold voltage of the active region 16 in the edge part of the element isolation region 11 and the drain current is concentrated in the channel center part, an occurrence of an RTS noise caused by a trap existing in the edge part of the element isolation region 11 can be suppressed. In addition, since the gate insulating film 14 in the channel center part is made as a thick film, the MOSFET can be driven with a higher gate voltage and a higher drain voltage. In other words, with the electrode structure according to the sixth embodiment, an occurrence of an RTS noise is suppressed and both of the effect that the RTS noise is reduced and the effect that the MOSFET is driven by a higher gate voltage and a higher drain voltage can be obtained.

Eighth Embodiment

Figure 11A:
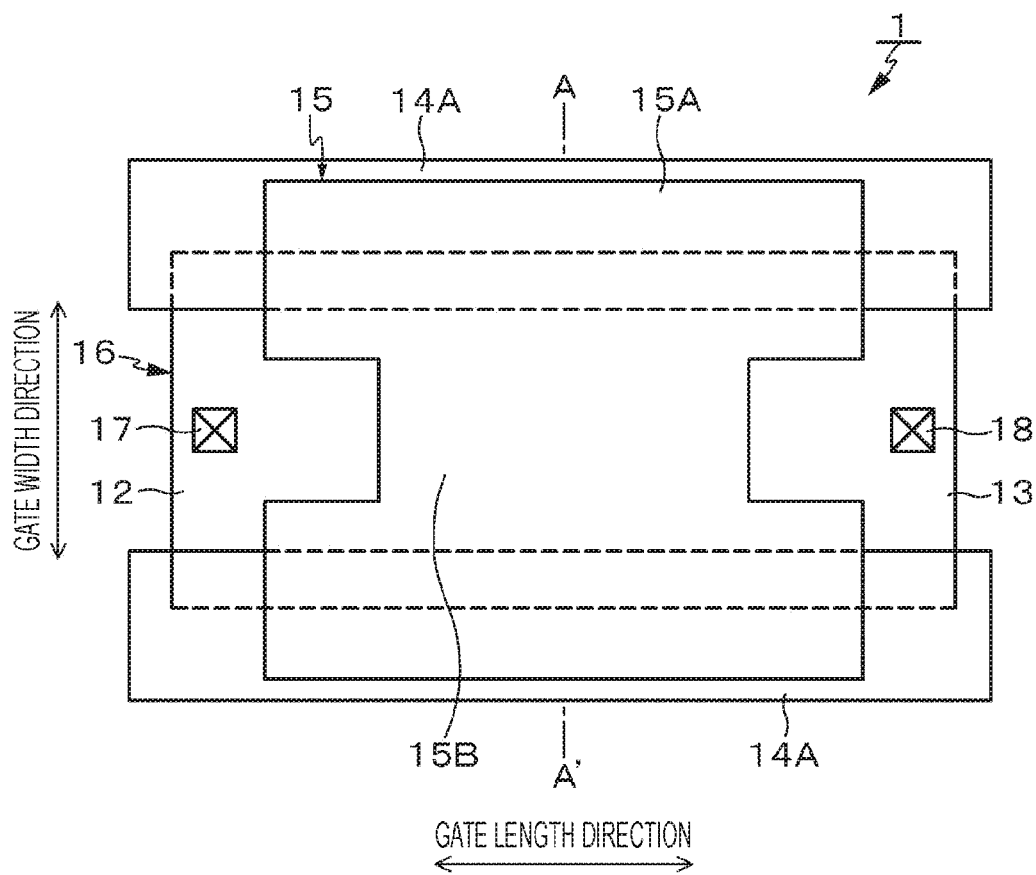
FIG. 11A is a schematic plan view of a MOSFET according to an eighth embodiment.
Figure 11B:
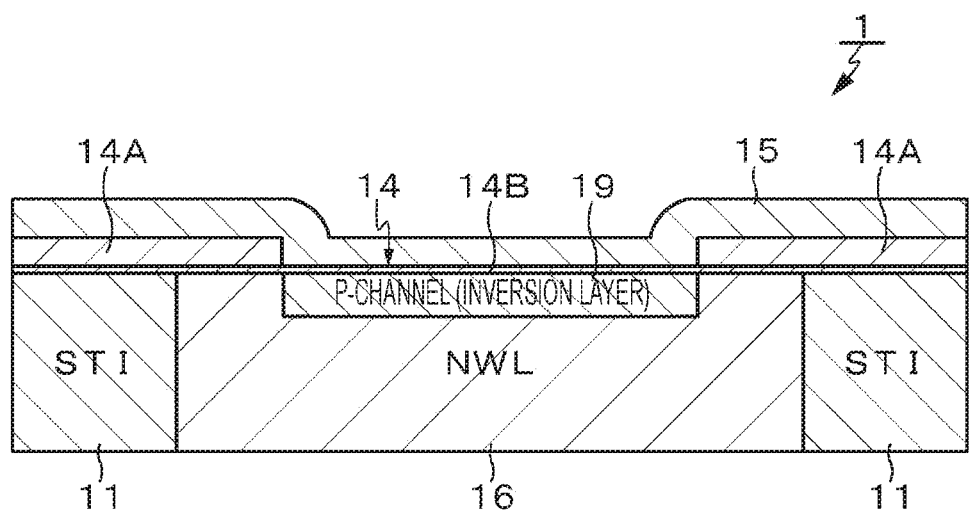
FIG. 11B is a sectional view taken along the line A-A' of FIG. 11A.

The eighth embodiment describes an example of being applied to a P-type MOSFET. FIG. 11A illustrates a schematic plan view of a MOSFET according to the eighth embodiment, and FIG. 11B is a sectional view taken along the line A-A' in FIG. 11A. According to the eighth embodiment which is applied to the P-type MOSFET, the basic configuration is the same as that of the first embodiment and the conducting type of each unit composing the MOSFET 1 is made as a revers conducting type compared to the case of the first embodiment which is applied to an N-type MOSFET.

Even in the MOSFET 1 according to the eighth embodiment, since the drain current density is concentrated in the channel center part, which is an electrode region 15B being shorter in the gate length direction of the gate electrode 15, this makes a condition that a carrier capture/emission of a trap, which exists in the edge area of the element isolation region 11 and causes an RTS noise, is unlikely to occur. With this configuration, since an occurrence of an RTS noise can be suppressed and the RTS noise can be reduced.

The electrode structure according to the second to seventh embodiments, which is applied to an N-type MOSFET, may be applied to a P-type MOSFET, as in the MOSFET 1 according to the eighth embodiment.

In the above described MOSFET 1 according to the first to eighth embodiments, the potential at the border between the element isolation region 11 and active region 16 becomes shallower than the potential at the channel center part, and most part of the on-state current (drain current) starts to flow in the channel center part, and hardly flows in vicinity of the edge part of the element isolation region 11. With this configuration, a carrier capture/emission of a trap, which exists in the edge part of the element isolation region 11 and causes an RTS noise, is unlikely to occur. Thus, since an occurrence of an RTS noise can be suppressed without creating an embedded-channel MOSFET, the RTS noise can be reduced without increasing the manufacturing cost.

Figure 12:
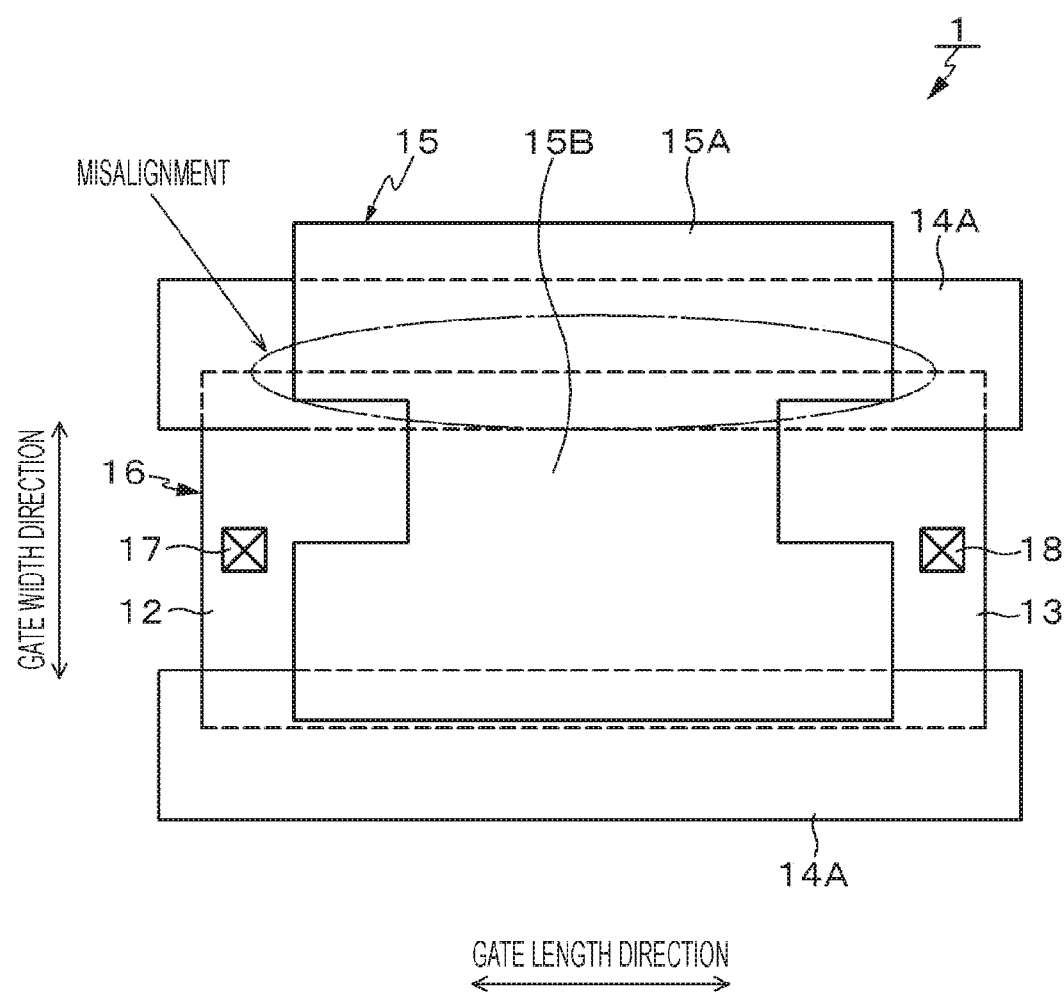
FIG. 12 is a schematic plan view illustrating a case that a misalignment is caused between an active region and a gate electrode during a manufacturing process.

Further, with the gate insulating film 14, in the electrode structure according to the embodiments, other than the second embodiment that includes a thick film configuration, the following operation and effect can also be obtained in addition to the above described operation and effect. For example, it is assumed a case that a misalignment of the active region 16 and gate electrode 15 happens in a manufacturing process of the MOSFET 1. In this case, for example, as illustrated in FIG. 12, the gate electrode 15 is shifted to one side in the fate width direction with respect to the active region 16, and the electrode region 15B which is shorter in the channel length direction of the gate electrode 15 is formed to be close to the edge part of the element isolation region 11.

Even in a case where it is formed as an electrode structure having such a misalignment, since the gate insulating film 14 near the border of the element isolation region 11 and active region 16S is made as a thick film and it is made in a configuration that the threshold voltage in the active region 16 near the border is high, the potential at the edge part of the element isolation region 11 becomes shallower. With this configuration, the on-state current (drain current) is kept to hardly flow in the edge part of the element isolation region 11, and an occurrence of an RTS noise caused by a trap, which exists in the edge part of the element isolation region 11, can be suppressed. In other words, this has an effect to suppress an occurrence possibility of an RTS noise in the misalignment of the active region 16 and gate electrode 15 generated in a manufacturing process and to make a production yield stable.

<Semiconductor Integrated Circuit>

Figure 13:
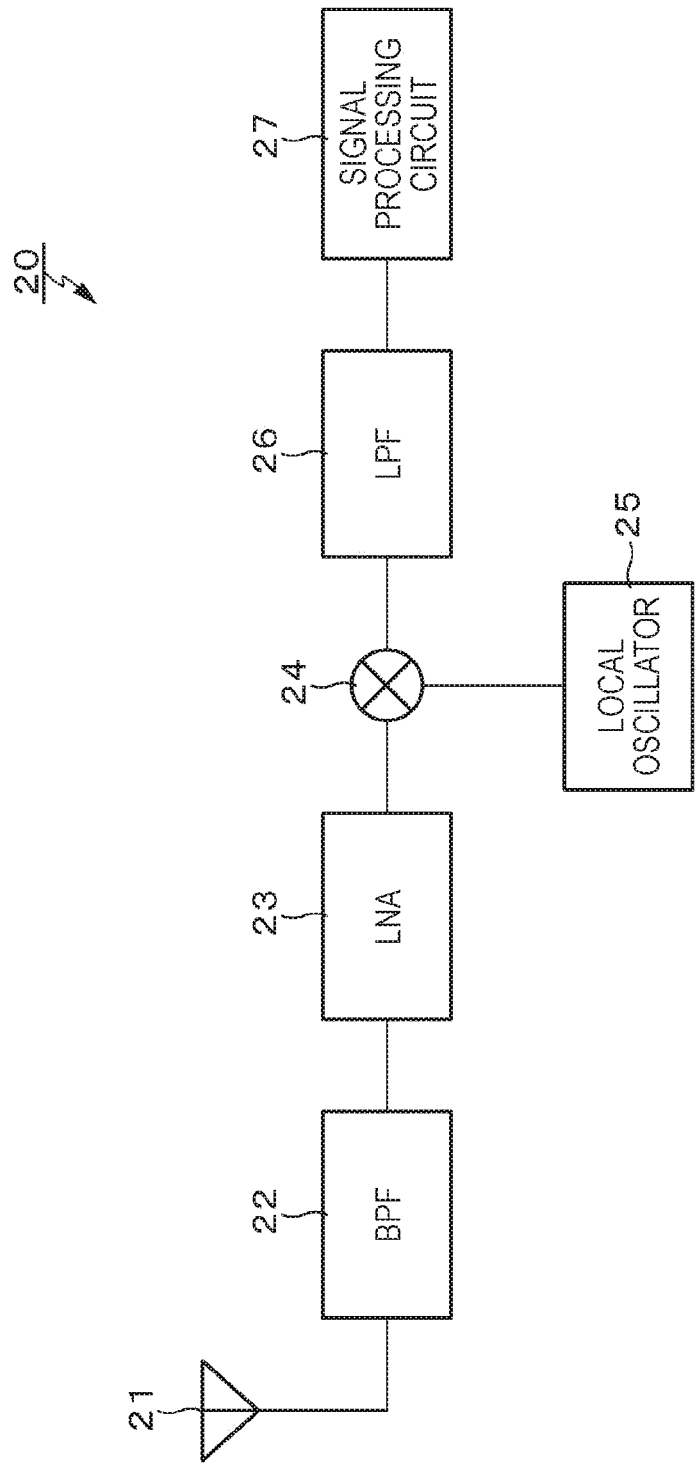
FIG. 13 is a block diagram illustrating an example of a configuration of a high-frequency receiving circuit.

The MOSFET 1 according to the above described first to eighth embodiments can be applied to a MOSFET that composes a low-noise amplifier, in which lower noise is required, or a local oscillator, in a high-frequency receiving circuit used in a wireless communications device. FIG. 13 illustrates a block diagram of a configuration example of a high-frequency receiving circuit.

A high-frequency receiving circuit 20 according to this example includes a reception antenna 21, a band-pass filter (BPF) 22, a low-noise amplifier (LNA: Low Noise Amp) 23, a mixer 24, a local oscillator 25, a low-pass filter (LPF) 26, and a signal processing circuit 27. In the high-frequency receiving circuit 20, for example, the low-noise amplifier 23 and local oscillator 25 are semiconductor integrated circuits formed with a MOSFET.

Then, by applying the MOSFET 1 according to the above descried first to eighth embodiments to the MOSFET that composes the low-noise amplifier 23 and local oscillator 25 described as an example of a semiconductor integrated circuit, the MOSFET 1 can reduce a RTS noise. As a result, the low-noise amplifier 23 and local oscillator 25 can be made to generate less noise.

As an electronic device in which the high-frequency receiving circuit 20 is used, there may be
- a mobile phone,
- a wireless device for a wireless local area network (LAN), a wireless keyboard, and the like,
- a television tuner,
- a global positioning system (GPS),
- an electronic toll collection System (ETC), and the like.

Further, as an electronic device in which a low-noise operational amplifier formed with a MOSFET as a semiconductor integrated circuit is used, there may be
- an audio device,
- an industrial robot and its control device,
- consumer electronics (a refrigerator, a vacuum cleaner, a washing machine, an air-conditioning and heating equipment, and the like),
- a measuring device,
- a medical device,
- a desktop personal computer (PC), a laptop PC, and a tablet computer terminal,
- a printer, a scanner, and a projector,
- an image processing device such as a digital camera and a video camera,
- a security device, and the like.

<Solid-State Image Sensor>

Further, as a semiconductor integrated circuit formed with a MOSFET, there may be a CMOS solid-state image sensor (CMOS image sensor). In addition, the MOSFET 1 according to the above described first to eighth embodiments may be applied to the MOSFET, which composes a circuit part of the CMOS solid-state image sensor. In the following, a CMOS solid-state image sensor, to which the MOSFET 1 according to the first to eighth embodiments is applied, will be described.

[System Configuration]

Figure 14:
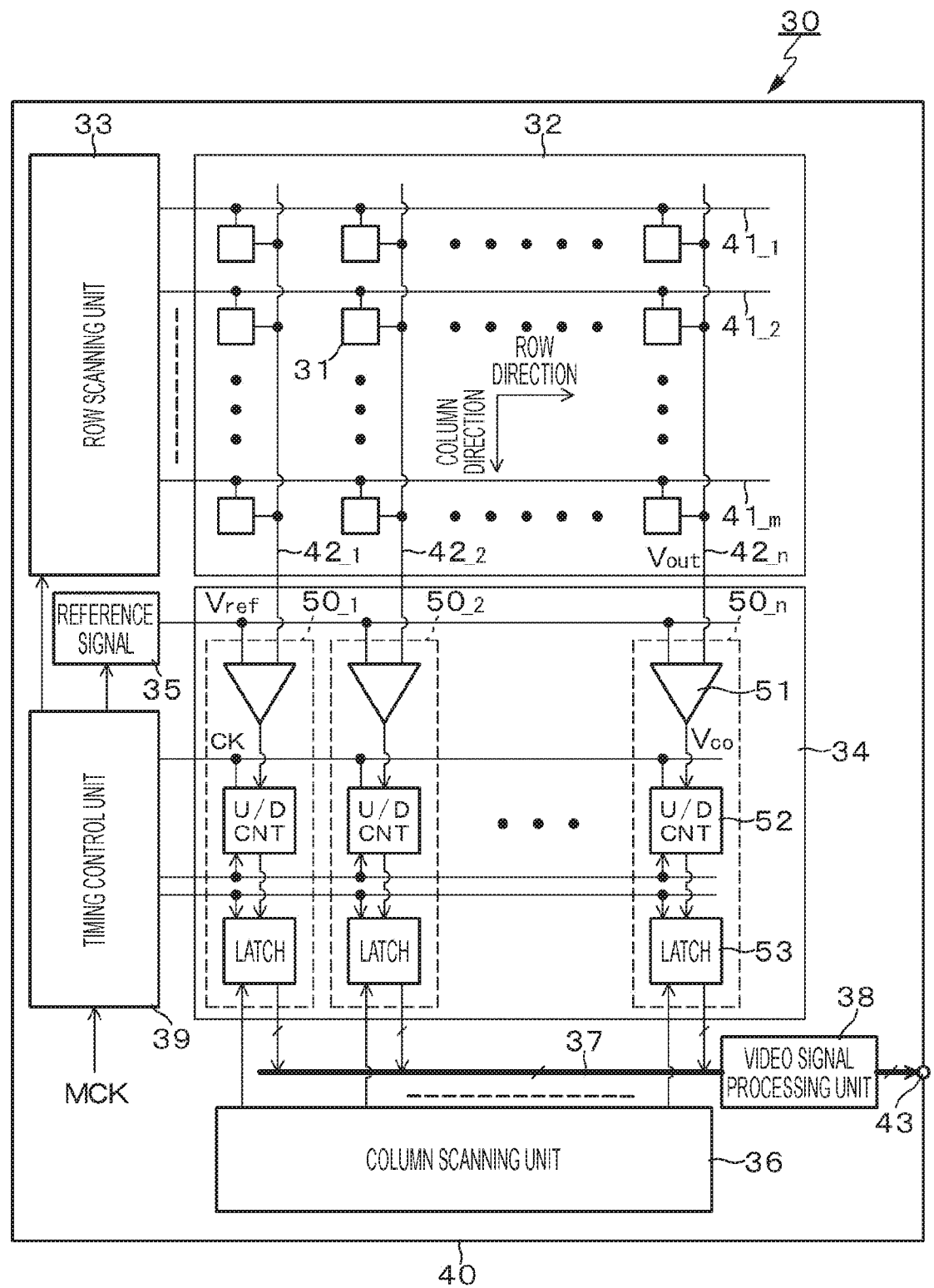
FIG. 14 is a system configuration diagram illustrating an outline of a configuration of a CMOS solid-state image sensor.

FIG. 14 is a system configuration diagram illustrating an outline of a configuration of the CMOS solid-state image sensor. As illustrated in FIG. 14, the CMOS solid-state image sensor 30 described here includes a pixel array unit 32 including unit pixels 31 two-dimensionally arranged in a matrix manner, and a peripheral drive system for driving the respective pixels 31 in the pixel array unit 32, and a peripheral signal processing system. In this example, as the peripheral drive system and signal processing system, for example, a row scanning unit 33, a column processing unit 34, a reference signal generation unit 35, a column scanning unit 36, a horizontal output line 37, a video signal processing unit 38, and a timing control unit 39 are provided. The drive system and signal processing system are integrated on a semiconductor substrate (chip) 40 where the pixel array unit 32 is provided.

In this system configuration, the timing control unit 39 generates, on the basis of a master clock MCK, clock signals, control signals, and the like which are used as references of operations by the row scanning unit 33, column processing unit 34, reference signal generation unit 35, column scanning unit 36 and the like. The clock signals, control signals, and the like generated in the timing control unit 39 are provided, as drive signals, to the row scanning unit 33, column processing unit 34, reference signal generation unit 35, column scanning unit 36, and the like.

The pixel array unit 32 generates a photocharge corresponding to an intensity of a received light and is made in a configuration that the unit pixel (hereinafter, may also simply be referred to as a "pixel") 31 having accumulated photoelectric conversion elements are two-dimensionally arranged in a row and column directions, that is in a matrix manner. Here, the row direction represents a pixel arrangement direction in pixel rows and the column direction represents a pixel arrangement direction in a pixel column.

In the pixel array unit 32, in a m-row/n-column pixel array, row control lines 41 ($41_{-1}$ to $41_{-m}$) are arranged along the row direction for each pixel row, and column control lines 42 ($42_{-1}$ to $42_{-n}$) are arranged along the column direction for each pixel column. The row control line 41 transmits the control signal for controlling, in a case where a signal is read from the unit pixel 31. In FIG. 14, the row control line 41 is illustrated as a single line; however, the number of the lines is not limited to one. Each end of the row control lines $41_{-1}$ to $41_{-m}$ is connected to each output terminal corresponding to each line of the row scanning unit 33.

The row scanning unit 33 includes a shift register, an address decoder, and the like and drives each pixel 31 in the pixel array unit 32 for all pixels at once, per row, or the like. The specific configuration of the row scanning unit 33 is not illustrated but, in general, the row scanning unit 33 has a configuration including two scanning systems of a readout scanning system and a sweep-out scanning system. The readout scanning system selectively scans the unit pixels 31 in the pixel array unit 32 line by line in order to read a signal from the unit pixel 31. The signal read from the unit pixel 31 is an analog signal. The sweep-out scanning system performs sweep-out scanning in a readout line on which readout scanning is performed by the readout scanning system, prior to the readout scanning by an amount of a shutter speed time.

An unnecessary charge is swept out from the photoelectric conversion element of the unit pixel 31 of the readout row by the sweep-out scanning of the sweep-out scanning system, so that the photoelectric conversion element is reset. Then, the so-called electronic shutter operation is performed by the sweep-out (reset) of the unnecessary charge by the sweep-out scanning system. Here, the electronic shutter operation is an operation to discharge the photocharge of the photoelectric conversion element and to newly start exposure (start storage of photocharge).

The signal read out by the readout operation of the readout scanning system corresponds to the amount of light incident after the immediately preceding readout operation or the electronic shutter operation. In addition, a period from the readout timing of the immediately preceding readout operation or the sweep-out timing of the electronic shutter operation to the readout timing of this readout operation is an exposure period of photocharge in the unit pixel 31.

The column processing unit 34 is a signal processing unit including analog-to-digital (AD) converting devices 50 ($50_{-1}$ to $50_{-n}$) provided, for example, for each pixel column of the pixel array unit 32, that is, for each column control line 42 ($42_{-1}$ to $42_{-n}$) in one-to-one relationship. The AD converting devices 50 ($50_{-1}$ to $50_{-n}$) convert an analog signal (pixel signal) output from each unit pixel 31 in the pixel array unit 32 for each pixel column into a digital signal.

The reference signal generation unit 35 generates a reference signal $V_{ref}$ that a voltage value varies in a stepwise manner as time passes, that is, in ramp waveforms (an inclined waveform), as a reference signal used in an AD conversion. The reference signal generation unit 35 can be composed by using a digital to analog converter (DAC) for example. Here, the reference signal generation unit 35 is not limited to a configuration including a DAC.

Under a control by the timing control unit 39, the reference signal generation unit 35 generates reference signal $V_{ref}$ of a ramp waveform as a reference signal on the basis of a clock CK provided from the timing control unit 39. Then, the reference signal generation unit 35 provides the generated reference signal $V_{ref}$ to the AD converting devices $50_{-1}$ to $50_{-n}$ in the column processing unit 34.

The AD converting devices $50_{-1}$ to $50_{-n}$ all have the same configuration. In this example, the specific configuration will be described by taking the n-th AD converting device $50_{-n}$ as an example. The AD converting device $50_{-n}$ has a single-slope AD converting device configuration that includes a comparator 51, an up/down counter (indicated as a "U/DCNT" in the drawing) 52, for example, which serves as a count unit, and a latch 53.

The comparator 51 takes a signal voltage $V_{out}$ of the column control line $42_{-n}$ corresponding to a pixel signal output from each unit pixel 31 in the n-th column in the pixel array unit 32 as a comparison input and a reference signal $V_{ref}$ in a ramp waveform provided from the reference signal generation unit 35 as a reference input, and compares those inputs. Then, in the comparator 51, for example, an output $V_{co}$ becomes in a first state (a high level, for example) when the reference signal $V_{ref}$ is greater than the signal voltage $V_{out}$, and the output $V_{co}$ becomes in a second state (a low level, for example) when the reference signal $V_{ref}$ is equal to or lower than the signal voltage $V_{out}$.

The up/down counter 52 is an asynchronous counter. Under the control by the timing control unit 39, a clock CK is provided to the up/down counter 52 from the timing control unit 39 at the same timing with the reference signal generation unit 35. With this configuration, the up/down counter 52 measures a comparison period from a beginning of a comparison operation to an end of the comparison operation in the comparator 51 by counting down (DOWN) or counting up as synchronizing with the clock CK.

Under the control by the timing control unit 39, the latch 53 latches a count result by the up/down counter 52 at a timing when the up/down counter 52 completes counting the unit pixel 31 in one pixel row.

In this manner, via the column control lines $42_{-1}$ to $42_{-n}$ from the unit pixel 31 of the pixel array unit 32, the comparator 51 firstly executes the comparison operation on the analog signals provided for every pixel column, in the AD converting device $50_{-1}$ to $50_{-n}$. Then, since the up/down counter 52 performs the counting operation through out the period from the beginning of the comparison operation to the end of the comparison operation by the comparator 51, an analog signal is converted into a digital signal and stored in the latch 53.

The column scanning unit 36 includes a shift register, an address decoder, or the like, and controls column address and column scanning in the AD converting device $50_{-1}$ to $50_{-n}$, in the column processing unit 34. Under the control by the column scanning unit 36, digital signals which are AD-converted in the AD converting device $50_{-1}$ to $50_{-n}$ are sequentially read in the horizontal output line 37, and are output, as imaging data, from the output terminal 43 to outside the semiconductor substrate 40 via the video signal processing unit 38 for example.

Here, in the CMOS solid-state image sensor 30 including a column-parallel ADC, which has the above described configuration, the column processing unit 34 has been described as a configuration in which the AD converting device 50 is provided for ever column control line 42 in one-to-one state; however, the configuration is not limited to the arrangement in one-to-one state. For example, a single AD converting device 50 may be shared by a plurality of pixel columns and used by the plurality of pixel columns in a time-sharing manner.

[Pixel Configuration]

Figure 15:
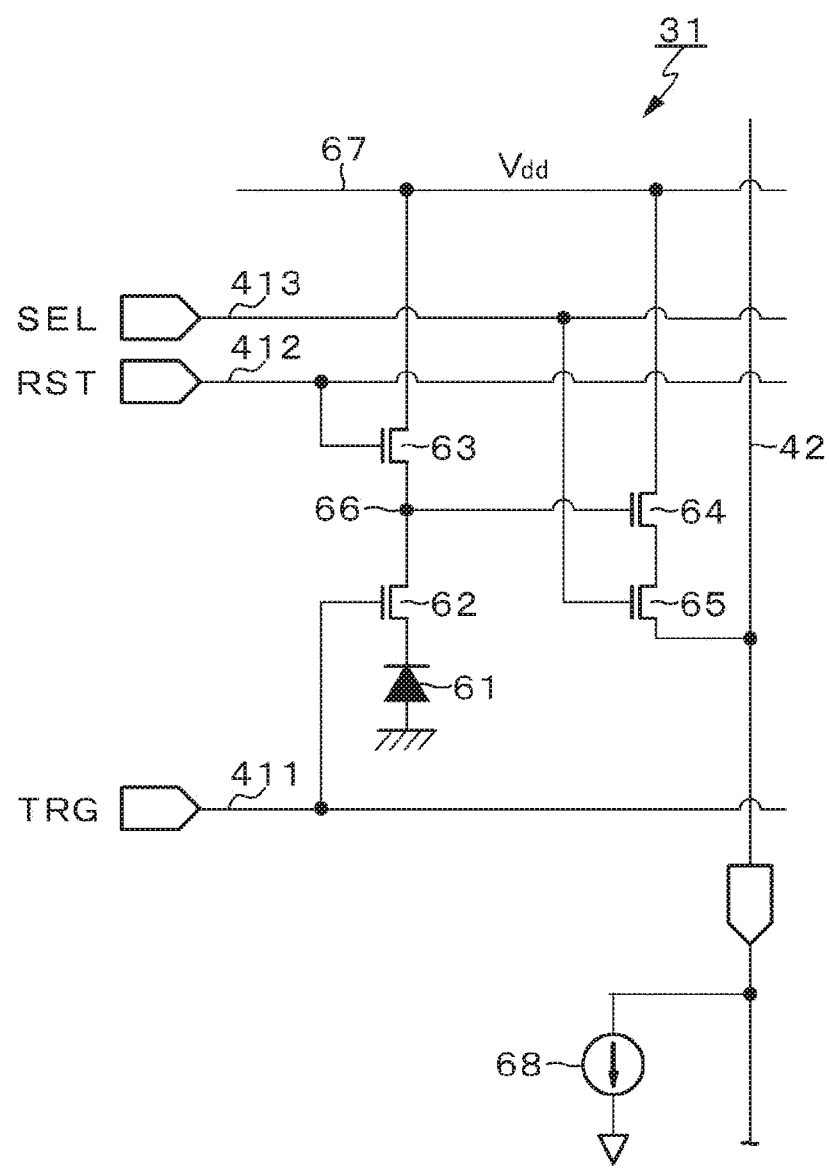
FIG. 15 is a circuit diagram illustrating an example of a circuit configuration of a unit pixel.

FIG. 15 is a circuit diagram illustrating an example of a circuit configuration of the unit pixel 31. As illustrated in FIG. 15, the unit pixel 31 according to the present example includes a photodiode (PD) 61 as a photoelectric conversion element, for example. In addition to the photodiode 61, for example, the unit pixel 31 includes a transfer transistor (transfer gate unit) 62, a reset transistor 63, an amplifying transistor 64, and a selection transistor 65.

Here, in this example, as the four transistors including the transfer transistor 62, reset transistor 63, amplifying transistor 64, and selection transistor 65, for example, an N-type MOSFET is used. Here, the combination of conductivity types of the four transistors 62 to 65 is only an example and it is not limited to this combination.

Regarding the unit pixel 31, as the above described row control lines 41 (41_1 to 41_m), a plurality of control lines 411, 412 and 413 are commonly provided for each pixel of the same pixel row. The plurality of control lines 411, 412, and 413 are connected to an output terminal corresponding to each pixel row of the row scanning unit 33 by the unit of pixel row. The row scanning unit 33 outputs a transfer signal TRG, a reset signal RST, and a selection signal SEL to the plurality of control lines 411, 412, and 413 according to need.

The photodiode 61 has an anode electrode connected to a low-potential-side power supply (a ground, for example), performs a photoelectric conversion from a received light into a photocharge (a photoelectron, in this case) having a charge amount corresponding to the light intensity, and accumulates the photocharge. A cathode electrode of the photodiode 61 is electrically connected to the gate electrode of the amplifying transistor 64 via the transfer transistor 62. The region which is electrically connected to the gate electrode of the amplifying transistor 64 is a charge detection unit 66 that converts charge into voltage. In the following, the charge detection unit 66 is referred to as an FD unit (floating diffusion, floating diffusion region, or impurity diffusion region) 66.

The transfer transistor 62 is connected between the cathode electrode of the photodiode 61 and the FD unit 66. To the gate electrode of the transfer transistor 62, the transfer signal TRG in which a high level (a $V_{dd}$ level, for example) becomes active (hereinafter, referred to as "High Active"), is provided from the row scanning unit 33 via the control line 411. The transfer transistor 62 becomes in a conductive state in response to the transfer signal TRG and transfers a photocharge, which is photoelectric-converted from and accumulated in the photodiode 61, to the FD unit 66.

A drain electrode of the reset transistor 63 is connected to the power cord 67 of the voltage $V_{dd}$, and a source electrode of the reset transistor 63 is connected to the FD unit 66 respectively. To the gate electrode of the reset transistor 63, a High Active reset signal RST is provided to the row scanning unit 33 via the control line 412. The reset transistor 63 becomes in a conductive state in response to the reset signal RST, and resets the FD unit 66 by discarding the charge in the FD unit 66 to the power cord 67.

A gate electrode of the amplifying transistor 64 is connected to the FD unit 66 and a drain electrode is connected to the power cord 67, respectively. The amplifying transistor 64 serves as an input unit of a source follower, which is a readout circuit that reads a signal obtained by a photoelectric conversion in the photodiode 61. In other words, in the amplifying transistor 64, by connecting its source electrode to the column control line 42 via the selection transistor 65, the current source 68 connected to one end of the column control line 42 and a source follower can be composed.

For example, in the selection transistor 65, its drain electrode of is connected to a source electrode of the amplifying transistor 64, and its source electrode is connected to the column control line 42, respectively. To the gate electrode of the selection transistor 65, a High Active selection signal SEL is provided from the row scanning unit 33 via the control line 413. The selection transistor 65 becomes in a conductive state in response to a selection signal SEL, and transmits a signal output from the amplifying transistor 64 to the column control line 42 as making the unit pixel 31 in a selection state.

Here, the selection transistor 65 may have a circuit configuration to be connected between the power cord 67 and the drain electrode of the amplifying transistor 64. Further, in this example, as a pixel circuit of the unit pixel 31, a 4Tr configuration including the transfer transistor 62, reset transistor 63, amplifying transistor 64, and selection transistor 65, which are four transistors (Tr), is described as an example; however, the configuration is not limited to this example. For example, the selection transistor 65 may be omitted, and the amplifying transistor 64 may have a 3Tr configuration including a function of the selection transistor 65 or a configuration including more transistors may be employed, according to need.

In the CMOS solid-state image sensor 30 having the configuration in which the above described unit pixels 31 are arranged, in general, a noise removal process by a correlated double sampling (CDS) is performed to remove noise caused during a reset operation. From the unit pixel 31, for example, a reset level $V_{rst}$ and a signal level $V_{sig}$ are read out in order. The reset level $V_{rst}$ corresponds to an electric potential of the FD unit 66 in a case where the FD unit 66 is reset to the power source voltage $V_{dd}$. The signal level $V_{sig}$ corresponds to an electric potential of the FD unit 66 in a case where the charge accumulated in the photodiode 61 is transferred to the FD unit 66.

In a readout method for firstly reading the reset level $V_{rst}$, since a random noise caused when resetting is maintained in the FD unit 66 in a signal level $V_{sig}$ which is read out by adding a signal charge, a noise amount same as the reset level $V_{rst}$ is maintained. Thus, by performing a correlated double sampling operation for subtracting the signal level $V_{sig}$ from the reset level $V_{rst}$, a noise-removed signal can be obtained. Further, a fixed pattern noise such as a threshold value variation of the amplifying transistor 64 which is used to read a signal can also be removed.

In the column processing unit 34, a correlated double sampling process is executed in a case of an AD conversion. More specifically, in the column processing unit 34, the up/down counter 52 is used as a unit to measure a comparison period from a beginning of the comparison operation to an end of the comparison operation in the comparator 51. Here, in a case of the measurement operation, for the reset level $V_{rst}$ and signal level $V_{sig}$ which are read from the unit pixel 31 respectively, the up/down counter 52 counts down the reset level $V_{rst}$ and counts up the signal level $V_{sig}$, for example. By the count down/up operation, a difference between the signal level $V_{sig}$ and reset level $V_{rst}$ can be taken. As a result, in the column processing unit 34, a correlated double sampling process is performed during the AD conversion process.

The CMOS solid-state image sensor 30 including the above described column-parallel ADC is formed by connecting, via a multilevel interconnection, the photodiode 61 formed on the semiconductor substrate 40, a MOSFET including two types of a diffusion layer and a gate insulating film which have different film thickness, a bipolar transistor, a resistive element, and a capacitative element. As the MOSFET having gate insulating films in different layer thickness, for example, a thick-film MOSFET having the gate insulating film thickness of about 5.5 [nm] and a thin-film MOSFET having the gate insulating film thickness of about 2.5 [nm] can be described as an example. As a method for generating these circuits on the semiconductor substrate 40, a forming method using a general CMOS process is used.

First Application Example

In the CMOS solid-state image sensor 30 illustrated in FIG. 14, the MOSFET 1 according to the above described first to seventh embodiments can be applied to an N-type MOSFET used in the comparator 51 that composes an AD converting device 50. The case of applying the CMOS solid-state image sensor 30 to the MOSFET used in the comparator 51 will be described as a first application example.

Figure 16A:
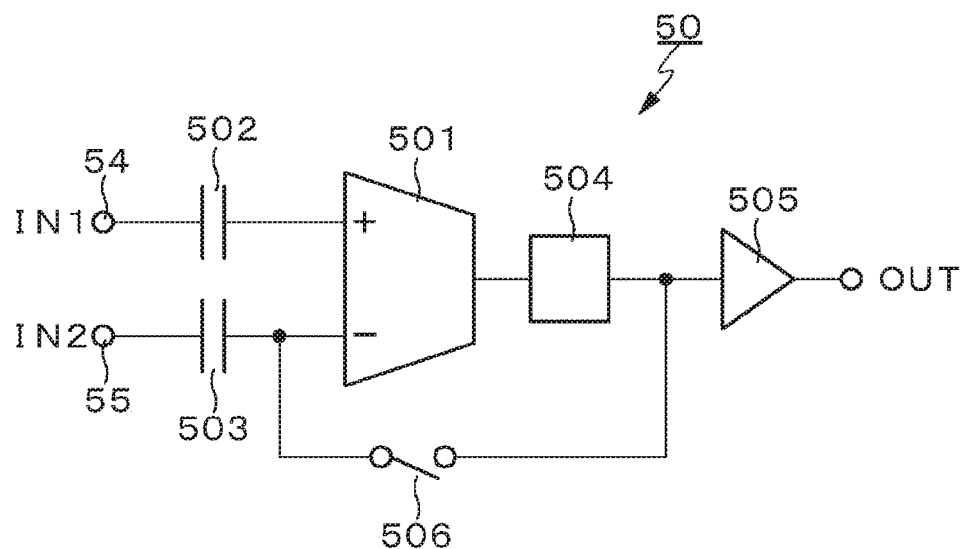
FIG. 16A is a block diagram illustrating an example of a configuration of a single-slope AD converting device.

FIG. 16A illustrates an example of a configuration of a single-slope AD converting device 50. The AD converting device 50 according to the present example includes a transconductance amplifier (hereinafter, referred to as a "Gm amplifier") 501 and has a configuration that sampling capacities 502 and 503 are connected between a non-inversion (+) input terminal and an inversion (−) input terminal of the Gm amplifier 501 and two input terminals 54 and 55. In a later stage of the Gm amplifier 501, an isolator 504 for suppressing a voltage variation is provided and, in a later stage of the isolator 504, amplifier 505 is provided. Further, between the inversion (−) input terminal of the Gm amplifier 501 and an output terminal of the isolator 504, an auto-zero switch 506 is connected.

In the correspondence relation with the single-slope AD converting device 50 illustrated in FIG. 14, a reference signal $V_{ref}$ generated in the reference signal generation unit 35 is input to the input terminal 54 as an input signal IN1. Further, to the other input terminal 55, a pixel signal read from the unit pixel 31 is input via the column control line 42.

Figure 16B:
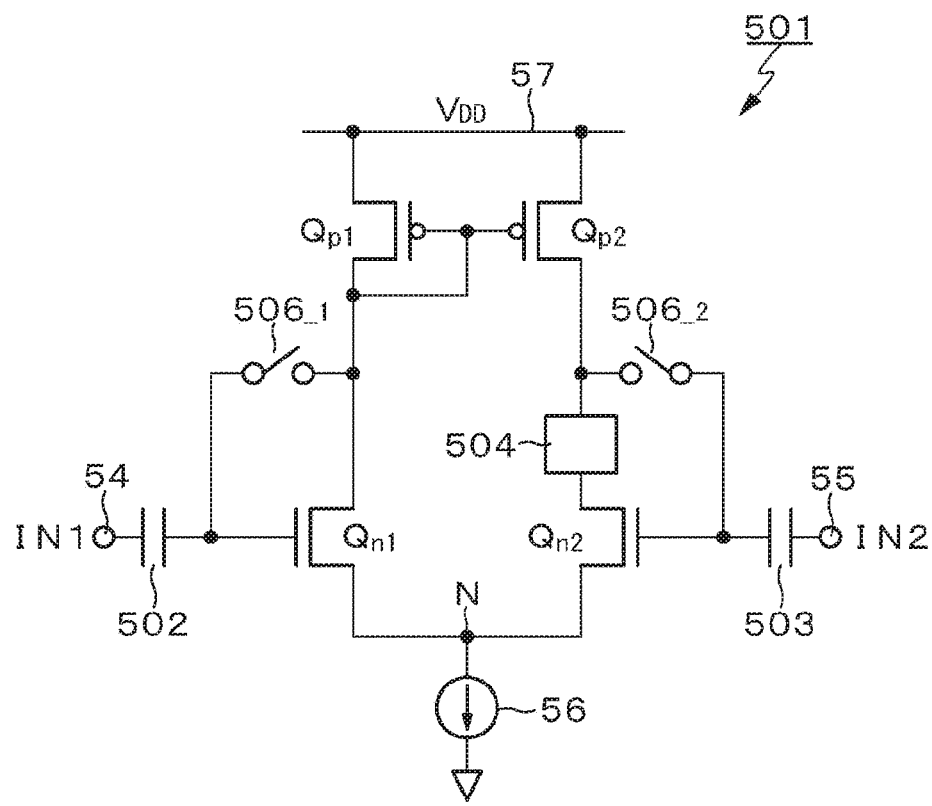
FIG. 16B is a circuit diagram illustrating an example of a circuit configuration of a Gm amplifier, which is an initial stage circuit of the single-slope AD converting device.

FIG. 16B illustrates an example of a circuit configuration of a Gm amplifier 501 which is an initial stage circuit of the single-slope AD converting device 50. The Gm amplifier 501 includes differential pair transistors $Q_{n1}$ and $Q_{n2}$ including an N-type MOSFET and has a configuration in which a common connection node N of sources of the differential pair transistors $Q_{n1}$ and $Q_{n2}$ is connected to the low-potential-side power supply via the current source 56. Further, in the side of the power cord 57 of the voltage $V_{DD}$, P-MOS transistors $Q_{p1}$ and $Q_{p2}$ which are composing a current mirror circuit are provided.

Here, between the gate electrode and drain electrode of the N-MOS transistor $Q_{n1}$, an auto-zero switch $506_{-1}$ is connected. Further, the isolator 504 is connected to a drain electrode of the N-MOS transistor $Q_{n2}$, and an auto-zero switch $506_{-2}$ is connected between a gate electrode of the N-MOS transistor $Q_{n2}$ and an output terminal of the isolator 504.

In the Gm amplifier 501 of the single-slope AD converting device 50 having the above configuration, the MOSFET 1 according to the above described first to seventh embodiments is applied to the N-type MOSFET used as the differential pair transistors $Q_{n1}$ and $Q_{n2}$. Here, FIG. 17 illustrates a plot graph of a cumulative frequency of 100,000 pieces of output noise data of the AD converting device 50, regarding the CMOS solid-state image sensor 30 in which the MOSFET 1 according to the first to seventh embodiments, that is, the MOSFET 1 that can reduce an RTS noise, is applied to the MOSFET that composes the single-slope AD converting device 50.

Figure 17:
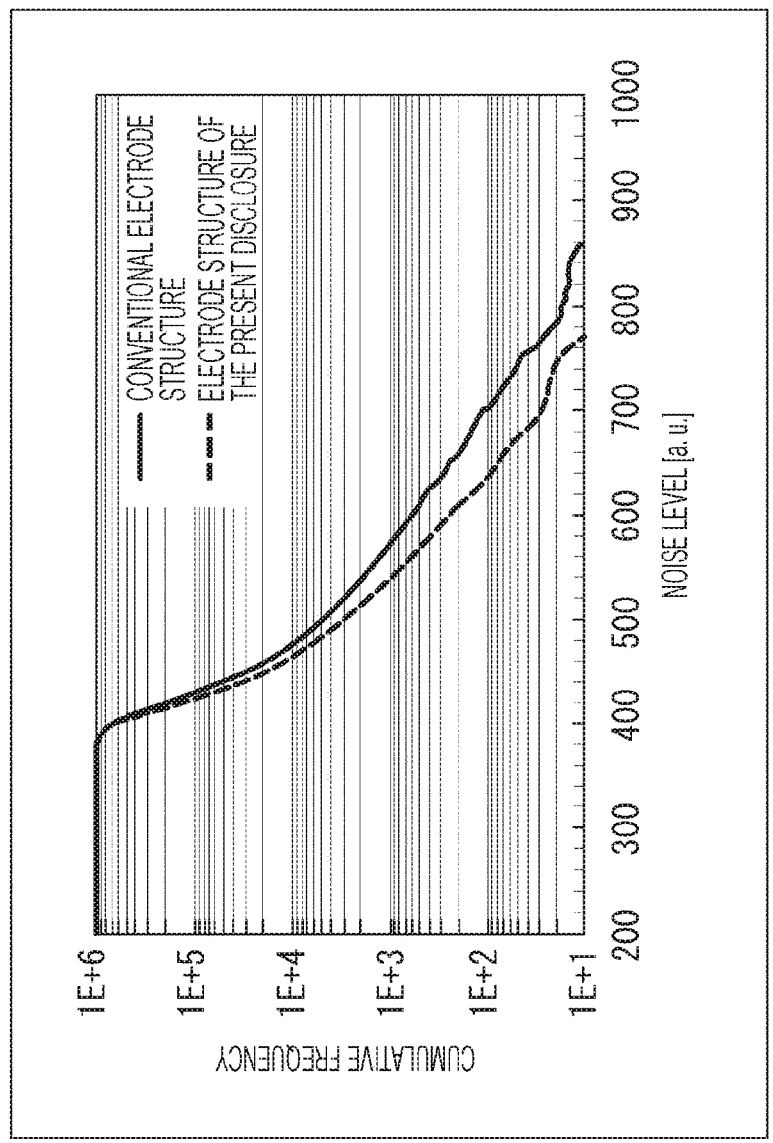
FIG. 17 is a diagram illustrating a plot graph of a cumulative frequency of 100,000 pieces of output noise data from the AD converting device in a CMOS solid-state image sensor in which a MOSFET according to the first to seventh embodiments is applied to a MOSFET that composes a single-slope AD converting device.

FIG. 17 illustrates a case of a comparison with a single-slope AD converting device including a conventional electrode structure MOSFET, that is, a single-slope AD converting device which does not use the MOSFET 1 according to the first to seventh embodiments. In FIG. 17, the dashed line illustrates the case of the electrode structure of the present disclosure (a case that the MOSFET 1 according to the first to seventh embodiments is applied), and the continuous line illustrates the case of the conventional electrode structure (a case that the MOSFET 1 according to the first to seventh embodiments is not applied). According to the plot graph of the cumulative frequency of output noise data in FIG. 17, compared to the case of the conventional electrode structure, it can be confirmed that the noise level of the case of the electrode structure of the present disclosure is reduced in a case of being compared in the same occurrence probability.

Second Application Example

In the CMOS solid-state image sensor 30 illustrated in FIG. 14, the MOSFET 1 according to the above described first to seventh embodiments can be applied to the N-type MOSFET used as the amplifying transistor 64 (see FIG. 15) that composes the unit pixel 31. A case that the MOSFET 1 according to the above described first to seventh embodiments is applied to the MOSFET used to the amplifying transistor 64 will be described as a second application example.

Figure 18:
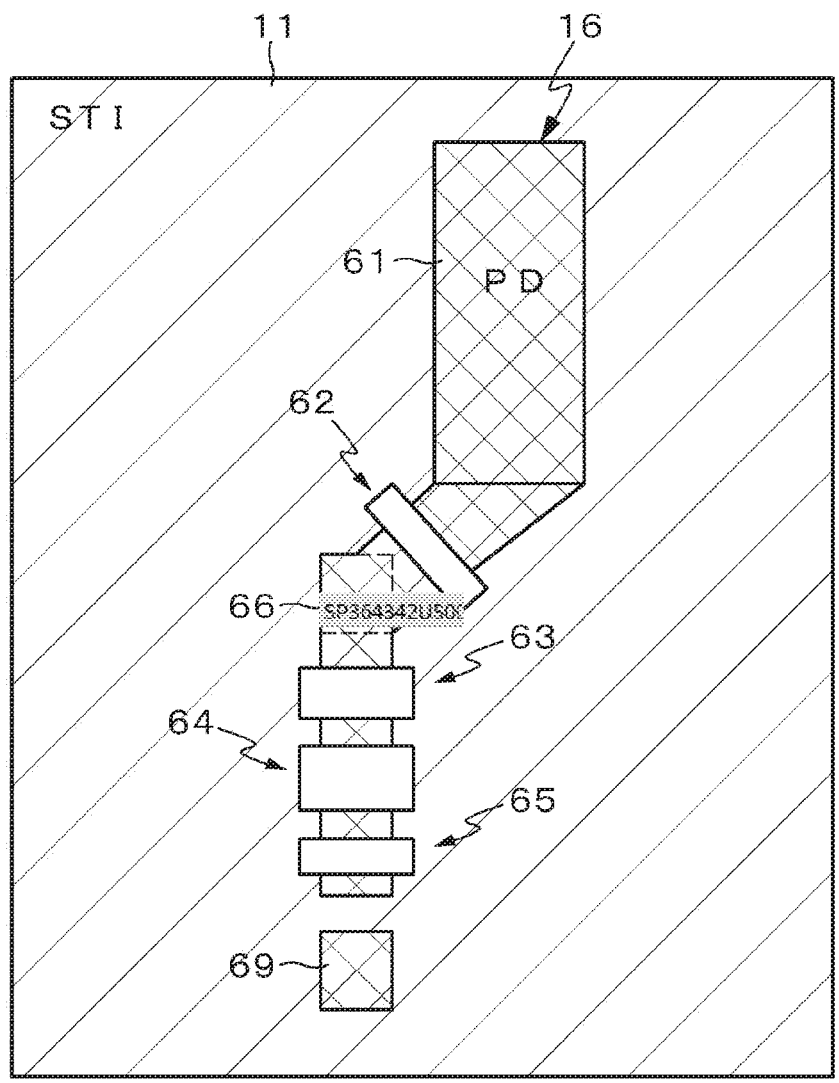
FIG. 18 is a layout diagram of elements (which are a photodiode, a transfer transistor, a reset transistor, an amplifying transistor, and a selection transistor) which compose the unit pixel.

FIG. 18 illustrates a layout of the elements that compose the unit pixel 31, which are a photodiode (PD) 61, a transfer transistor 62, a reset transistor 63, an amplifying transistor 64, and a selection transistor 65. In FIG. 18, the hatched area represents an element isolation region 11, the check pattern areas represent the active region 16, the white areas represent the transfer transistor 62, reset transistor 63, amplifying transistor 64, and each gate electrode of the selection transistor 65. A well tap unit 69 is an electric potential connection unit to connect with a fixed electric potential.

Random noise generated by the CMOS solid-state image sensor 30 is mainly RTS noise generated by the amplifying transistor 64 including, for example, the N-type MOSFET in the unit pixel 31. Here, the electrode structure according to the above described first to seventh embodiments is applied to the electrode structure of the amplifying transistor 64 including the N-type MOSFET. With this configuration, the RTS noise generated by the amplifying transistor 64 can be reduced and this can reduce the noise of the CMOS solid-state image sensor 30 as a result.

First Illustrative Example

Figure 19:
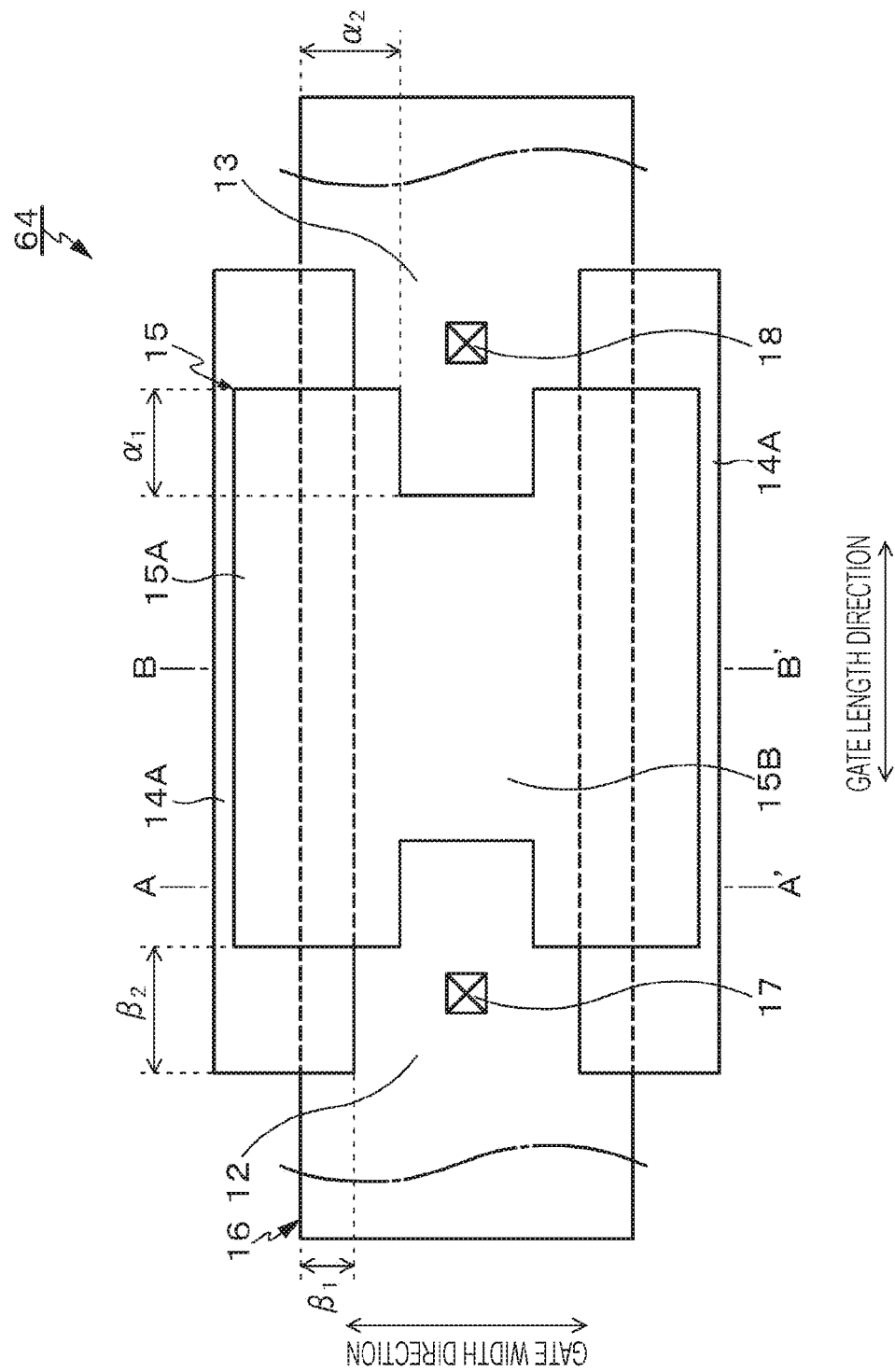
FIG. 19 is a schematic plan view of a MOSFET according to a first illustrative example in which an electrode structure according to the first embodiment is applied to an electrode structure of an amplifying transistor.
Figure 20A:
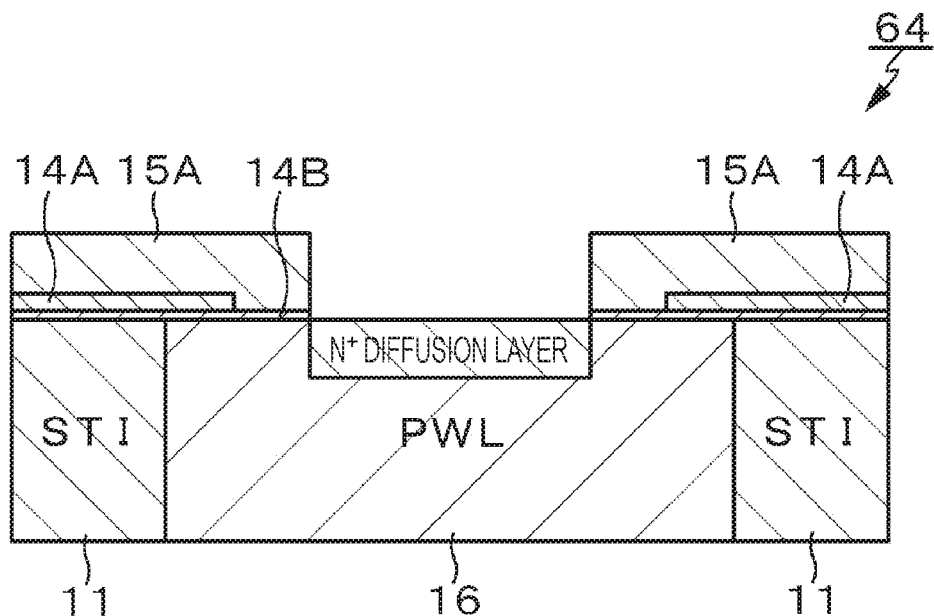
FIG. 20A is a sectional view taken along the line A-A' of FIG. 19.
Figure 20B:
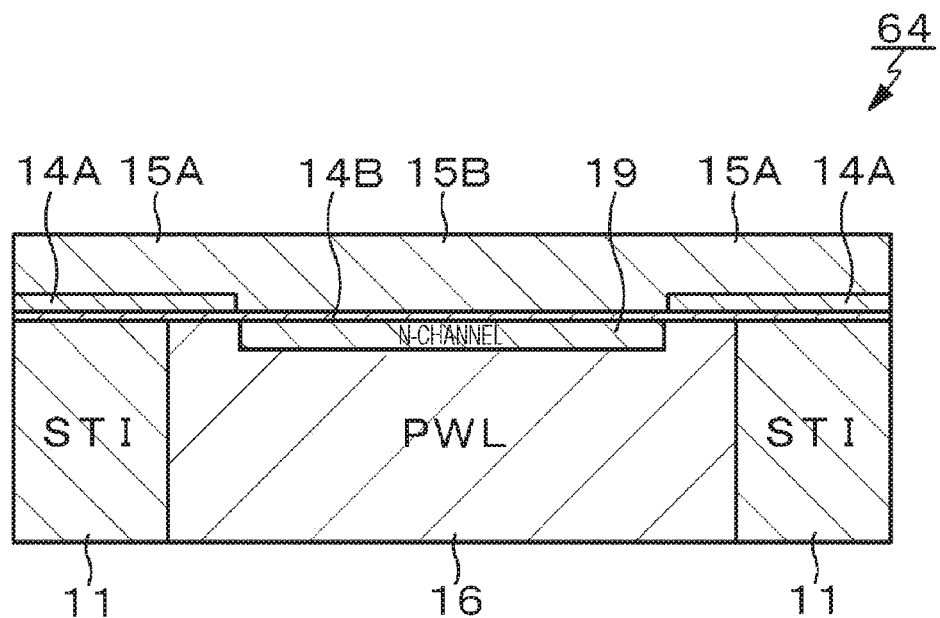
FIG. 20B is a sectional view taken along the line B-B' of FIG. 19.

A first illustrative example is an example that the electrode structure according to the first embodiment (see FIGS. 1 and 2), for example, is applied to an electrode structure of the amplifying transistor 64. FIG. 19 illustrates a schematic plan view of the MOSFET according to the first illustrative example. Further, FIG. 20A illustrates a sectional view taken along the line A-A' in FIG. 19, and FIG. 20B illustrates a sectional view taken along the line B-B' in FIG. 19.

In the MOSFET according to the first illustrative example, an electrode structure of the amplifying transistor 64 including the active region (P-type well region) 16 defined by the element isolation region (STI) 11 is made as follows.

As illustrated in FIG. 19, the gate electrode 15 has a planar shape which is symmetric in the gate length direction and gate width direction and has an electrode structure in which the length of the border part between the element isolation region 11 and active region 16 in the gate length direction is discontinuous in the gate width direction. In FIG. 19, it is preferable that a dimensional difference $\alpha_1$ between an end of the longer electrode region 15A and an end of the shorter electrode region 15B, and a dimension $\alpha_2$ between the inner side of the longer electrode region 15A and an outer side of the active region 16 are both equal to or greater than 0.05 [um], and they are set as 0.1 [um] for example.

The gate insulating film 14 provided on the front face of the active region 16 is provided on the channel region 19 between the source region 12 and drain region 13, and includes a thick-film region 14A provided on the border part between the element isolation region 11 and active region 16 and a thin-film region 14B provided in the channel center part. In other words, the gate insulating film 14 has a configuration in which its thickness at the border part between the element isolation region 11 and active region 16 is greater than its thickness at the channel center part.

In FIG. 19, it is preferable that a dimension $\beta_1$ between an inner side of the thick-film region 14A and an outer side of the active region 16 and a dimension $\beta_2$ between an edge of the thick-film region 14A and an edge of a longer part 15A of the gate electrode 15 are both equal to or greater than 0.05 [um], and are set as 0.1 [um] for example. In addition, it is preferable that a film thickness difference $T_1-T_2$ between a film thickness $T_1$ of the thick-film region 14A and a film thickness $T_2$ of the thin-film region 14B is equal to or greater than 1 [nm]. For example, the film thickness $T_1$ of the thick-film region 14A is set as 6 [nm] and the film thickness $T_2$ of the thin-film region 14B is set as 1.8 [nm].

Second Illustrative Example

Figure 22A:
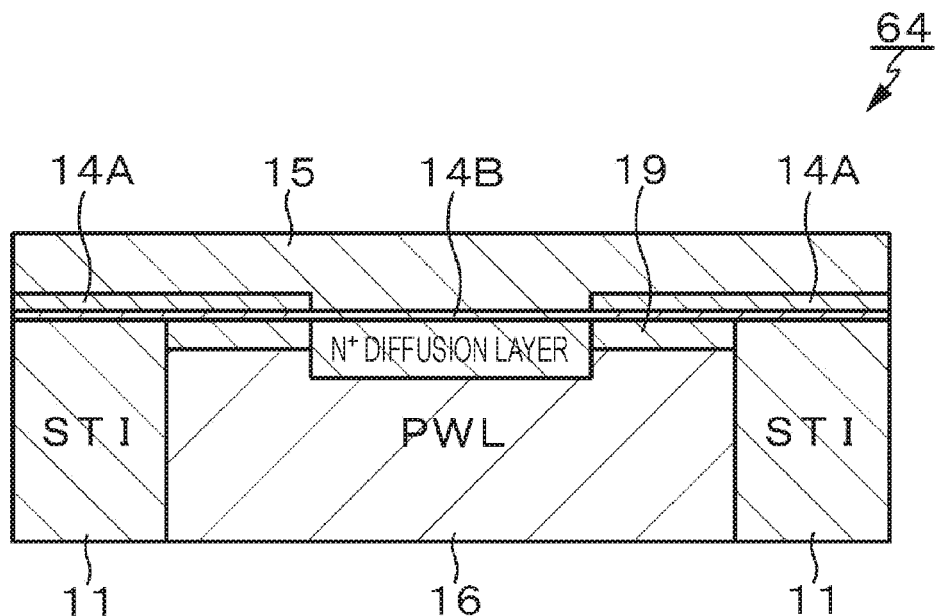
FIG. 22A is a sectional view taken along the line A-A' of FIG. 21
Figure 22B:
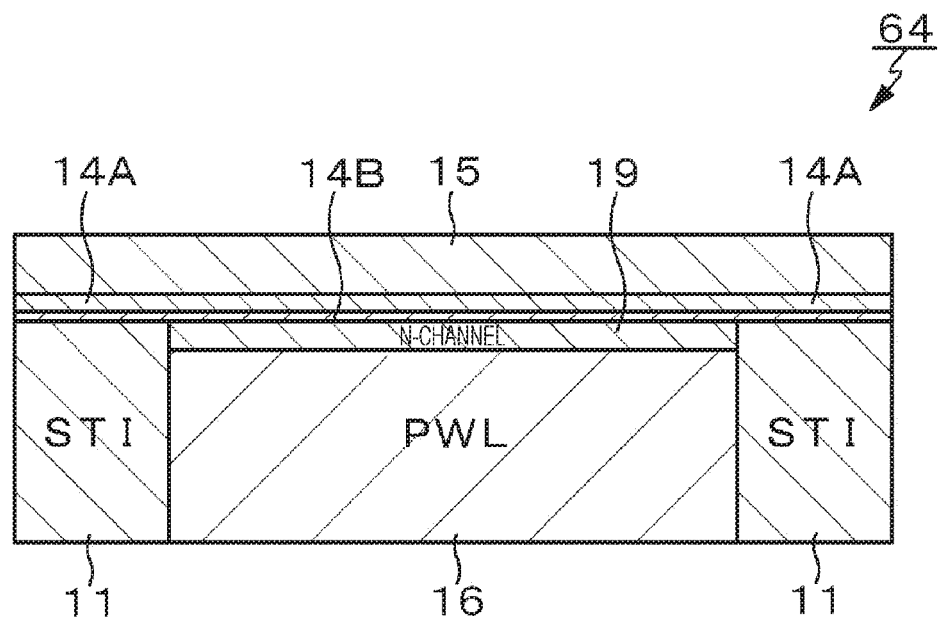
FIG. 22B is a sectional view taken along the line B-B' of FIG. 21.

A first illustrative example is an example in which the electrode structure according to the seventh embodiment (see FIG. 10B) for example is applied to the electrode structure of the amplifying transistor 64. FIG. 21 illustrates a schematic plan view of a MOSFET according to the second illustrative example that applies the electrode structure according to the seventh embodiment. Further, FIG. 22A illustrates a sectional view taken along the line A-A' of FIG. 21 and FIG. 22B illustrates a sectional view taken along the line B-B' of FIG. 21.

As illustrated in FIG. 21, the gate electrode 15 has a rectangular planar shape as in a general MOSFET. Further, the gate insulating film 14 has a configuration that the thick-film regions 14A and 14A are provided along the borders between the element isolation region 11 and active region 16 in the channel width direction and the thick connected region 14D is provided in the channel center part. In other words, in the gate insulating film 14, the thick-film regions (14A, 14A, and 14D) are formed in an H-shape in a planar view in the channel length direction with respect to the active region 16 and has a planar shape that is symmetric in the channel length direction and channel width direction.

In FIG. 21, it is preferable that a dimension $\gamma_1$ between an inner side of the thick-film region 14A and the border between the element isolation region 11 and active region 16, a dimension $\gamma_2$ between an edge face of the thick-film region 14A and an edge face of the gate electrode 15, and a dimension $\gamma_3$ between an edge face of the gate electrode 15 and an edge face of the connected region 14D are all equal to or greater than 0.05 [um], and are set as 0.1 [um] for example.

<Electronic Device>

The above described CMOS solid-state image sensor 30 can be used as an imaging unit (image capture unit) generally in an imaging device such as a digital still camera, a video camera, a mobile terminal device having an imaging function such as a mobile phone, and an electronic device such as a copy machine which uses a solid-state image sensor as the image read unit. Here, an imaging device may be used as the mode of the above described module provided in an electronic device, that is, a camera module.

[Imaging Device]

Figure 23:
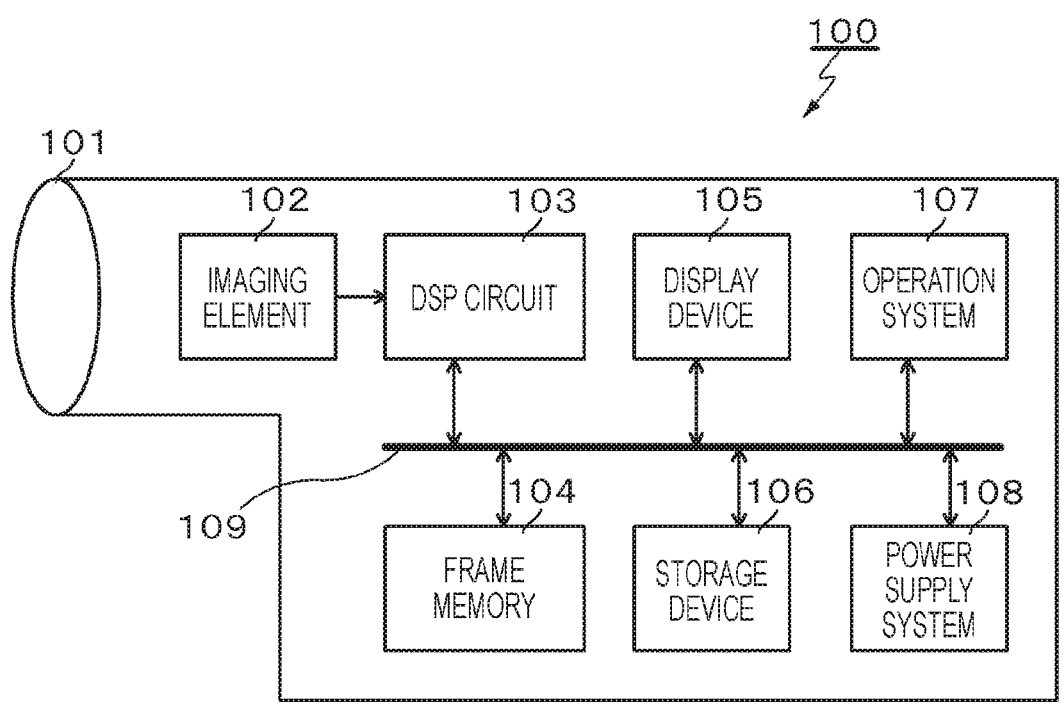
FIG. 23 is a block diagram illustrating an example of a configuration of an imaging device, which is an example of the electronic device according to the present disclosure.

FIG. 23 is a block diagram illustrating an example of a configuration of an imaging device which is an example of the electronic device according to the present disclosure. As illustrated in FIG. 23, the imaging device 100 according to the present example includes an optical system including a lens group 101 or the like, an imaging element 102, a DSP circuit 103 which is a camera signal processing unit, a frame memory 104, a display device 105, a storage device 106, an operation system 107, a power supply system 108, and the like. Here, the imaging device 100 has a configuration that the DSP circuit 103, frame memory 104, display device 105, storage device 106, operation system 107, and power supply system 108 are connected one another via a bus line 109.

The lens group 101 captures an incident light (image light) from a subject and forms an image on an imaging area of the imaging element 102. The imaging element 102 converts a light intensity of the incident light formed on the imaging area by the lens group 101 into an electric signal by the pixel unit and outputs the electric signal as a pixel signal. The display device 105 includes a panel display device such as a liquid crystal display device, an organic electro luminescence (EL) display device, and displays a moving image or a still image captured by the imaging element 102.

The storage device 106 records the moving image or still image captured by the imaging element 102 in a recording medium such as a memory card, a digital versatile disk (DVD). According to an operation by a user, the operation system 107 sends operation commands of various functions of the imaging device 100. The power supply system 108 provides various power, which are operation power sources of the DSP circuit 103, frame memory 104, display device 105, storage device 106, and operation system 107, to these providing targets according to need.

In the imaging device 100 having the above configuration, as the imaging element 102, the low-noise CMOS solid-state image sensor 30 to which the MOSFET according to the present disclosure is applied may be used as an N-type MOSFET used in the comparator 51 that composes the AD converting device 50 or a MOSFET used as the amplifying transistor 64 that composes the unit pixel 31. In addition, by using the low-noise CMOS solid-state image sensor 30 as the imaging element 102, an image quality of the imaging device 100 can be further improved.

Here, the present disclosure may be provided in the following configurations.

[1]

A MOS field-effect transistor including:
an element isolation region that defines an active region;
a source region and a drain region formed in the active region;
a gate insulating film provided on a channel region between the source region and the drain region; and
a gate electrode provided on the gate insulating film, in which
the gate electrode has an electrode shape in which a potential at a border part between the element isolation region and the active region becomes shallower than a potential at a channel center part.

[2]

The MOS field-effect transistor according to [1], in which
the gate electrode is made so that a length of the gate electrode in a gate length direction at the border part between the element isolation region and the active region is longer than a length of the gate electrode in the gate length direction at the channel center part.

[3]

The MOS field-effect transistor according to [2], in which
the gate insulating film is made so that a film thickness of the gate insulating film at the border part between the element isolation region and the active region is greater than a film thickness of the gate insulating film at the channel center part.

[4]

The MOS field-effect transistor according to [1], in which
the gate electrode includes a first electrode region provided on the channel region at a center of the active region, and a second electrode region which is connected to the first electrode region and provided on and along a border between the element isolation region and the active region.

[5]

The MOS field-effect transistor according to [4], in which
the second electrode region of the gate electrode is provided along the border between the element isolation region and the active region and covers a part of the element isolation region and a part of the active region, at an edge part of the element isolation region in the gate length direction, except for apart facing to contact units of the source region and the drain region.

[6]

The MOS field-effect transistor according to [5], in which
a plurality of contact units is provided to each of the source region and the drain region.

[7]

The MOS field-effect transistor according to [4], in which
the second electrode region of the gate electrode is provided along a border between the element isolation region and the active region only in a side of the source region or only in a side of the drain region, and covers the element isolation region and a part of the active region.

[8]

The MOS field-effect transistor according to any one of [5] to [7], in which
the gate insulating film has two thick-film regions, which are provided along the border between the element isolation region and the active region placed in both edge areas in the channel width direction and formed as thick films in regions corresponding to the part of the element isolation region and the part of the active region.

[9]
The MOS field-effect transistor according to [8], in which the two thick-film regions of the gate insulating film include a projecting region that projects in the channel center part side.

[10]
The MOS field-effect transistor according to [1], in which the gate electrode is formed in a rectangular electrode shape in a planar view, and
the gate insulating film includes two thick-film regions which are provided along a border between the element isolation region and the active region placed in both edge areas in the channel width direction and formed as thick films in regions corresponding to a part of the element isolation region and apart of the active region, and a thick-film connected region that connects the two thick-film regions in the channel center part.

[11]
A semiconductor integrated circuit including a MOS field-effect transistor,
the MOS field-effect transistor including:
an element isolation region that defines an active region;
a source region and a drain region formed in the active region;
a gate insulating film provided on a channel region between the source region and the drain region; and
a gate electrode provided on the gate insulating film, in which
the gate electrode has an electrode shape in which a potential at a border between the element isolation region and the active region becomes shallower than a potential at a channel center part.

[12]
A solid-state image sensor including:
a pixel array unit including unit pixels including a photoelectric conversion element which are arranged in a matrix manner; and
a circuit unit including a MOS field-effect transistor and configured to process a signal read from a pixel, in which
the MOS field-effect transistor includes
an element isolation region that defines an active region,
a source region and a drain region formed in the active region,
a gate insulating film provided on a channel region between the source region and the drain region, and
a gate electrode provided on the gate insulating film, and
the gate electrode has an electrode shape in which a potential at a border between the element isolation region and the active region becomes shallower than a potential in a channel center part.

[13]
The solid-state image sensor according to [12], in which the circuit unit is a signal processing unit having an AD converting device that includes a comparator for comparing a signal read from each pixel in the pixel array unit for each pixel column with a reference signal,
the comparator includes a MOS field-effect transistor,
the MOS field-effect transistor includes
an element isolation region that defines an active region,
a source region and a drain region formed in the active region,
a gate insulating film provided on the channel region between the source region and the drain region, and
a gate electrode provided on the gate insulating film, and
the gate electrode has an electrode shape in which a potential at the border between the element isolation region and the active region becomes shallower than a potential at the channel center part.

[14]
The solid-state image sensor according to [12], in which the unit pixel includes an amplifying transistor that amplifies a signal based on charge on which a photoelectric conversion is performed in the photoelectric conversion element,
the amplifying transistor includes a MOS field-effect transistor,
the MOS field-effect transistor includes
an element isolation region that defines an active region,
a source region and a drain region formed in the active region,
a gate insulating film provided in the channel region between the source region and the drain region, and
a gate electrode provided on the gate insulating film, and
the gate electrode has an electrode shape in which a potential at the border between the element isolation region and the active region becomes shallower than a potential at the channel center part.

[15]
An electronic device includes a solid-state image sensor as an imaging unit, in which
the solid-state image sensor includes:
a pixel array unit including pixels including a photoelectric conversion element which are arranged in a matrix manner; and
a circuit unit including a MOS field-effect transistor and configured to process a signal read from the pixels,
the MOS field-effect transistor includes:
an element isolation region that defines an active region;
a source region and a drain region formed in the active region;
a gate insulating film provided on a channel region between the source region and the drain region; and
a gate electrode provided on the gate insulating film, and
the gate electrode has an electrode shape in which a potential at a border between the element isolation region and the active region becomes shallower than a potential at a channel center part.

REFERENCE SIGNS LIST

1 MOSFET (MOS field-effect transistor)
11 Element isolation region
12 Source region
13 Drain region
14 Gate insulating film
15 Gate electrode
16 Active region
17, 18 Contact unit
19 Channel region
20 High-frequency receiving circuit
21 Reception antenna
22 Band-pass filter (BPF)
23 Low-noise amplifier (LNA)
24 Mixer
25 Local oscillator
26 Low-pass filter (LPF)
27 Signal processing circuit
31 Unit pixel
32 Pixel array unit
33 Row scanning unit
34 Column processing unit 35 Reference signal generation unit
36 Column scanning unit
37 Horizontal output line
38 Video signal processing unit
39 Timing control unit
40 Semiconductor substrate
41 ($41_{-1}$ to $41_{-m}$) Row control line
42 ($42_{-1}$ to $42_{-n}$) Column control line
$50_{-1}$ to $50_{-n}$ AD converting device
51 Comparator
52 Up/down counter
53 Latch
61 Photodiode (PD)
62 Transfer transistor (transfer gate unit)
63 Reset transistor
64 Amplifying transistor
65 Selection transistor
66 FD unit (charge detection unit)

The invention claimed is:
1. A MOS field-effect transistor, comprising:
an element isolation region that defines an active region;
a source region in the active region;
a drain region in the active region;
a gate insulating film on a channel region,
  wherein the channel region is between the source region and the drain region; and
a gate electrode on the gate insulating film, wherein
  a first length of the gate electrode at border parts of the gate electrode is longer than a second length of the gate electrode at a channel center part of the gate electrode,
  each of the border parts of the gate electrode is between the element isolation region and the active region,
  each of the first length and the second length is in a gate length direction,
  a first thickness of the gate insulating film at the border parts is greater than a second thickness of the gate insulating film at the channel center part,
  the channel center part of the gate electrode is between the border parts of the gate electrode, in a gate width direction, and
  the gate electrode has an electrode shape in which a potential at the border parts is shallower than a potential at the channel center part.

2. The MOS field-effect transistor according to claim 1, wherein
  the gate electrode includes a first electrode region provided on the channel region at a center of the active region, and a second electrode region which is connected to the first electrode region and provided on and along a border between the element isolation region and the active region.

3. The MOS field-effect transistor according to claim 2, wherein
  the second electrode region of the gate electrode is provided along the border between the element isolation region and the active region and covers a part of the element isolation region and a part of the active region, at an edge part of the element isolation region in the gate length direction, except for a part facing to contact units of the source region and the drain region.

4. The MOS field-effect transistor according to claim 3, wherein
  a plurality of contact units is provided to each of the source region and the drain region.

5. The MOS field-effect transistor according to claim 2, wherein
  the second electrode region of the gate electrode is provided along a border between the element isolation region and the active region only in a side of the source region or only in a side of the drain region, and covers the element isolation region and a part of the active region.

6. The MOS field-effect transistor according to claim 3, wherein
  the gate insulating film has two thick-film regions, which are provided along the border between the element isolation region and the active region placed in both edge areas in a channel width direction and formed as thick films in regions corresponding to the part of the element isolation region and the part of the active region.

7. The MOS field-effect transistor according to claim 6, wherein
  the two thick-film regions of the gate insulating film include a projecting region that projects in a side of the channel center part.

8. The MOS field-effect transistor according to claim 1, wherein
  the gate electrode is formed in a rectangular electrode shape in a planar view, and
  the gate insulating film includes two thick-film regions which are provided along a border between the element isolation region and the active region placed in both edge areas in a channel width direction and formed as thick films in regions corresponding to a part of the element isolation region and a part of the active region, and a thick-film connected region that connects the two thick-film regions in the channel center part.

9. A semiconductor integrated circuit, comprising:
a MOS field-effect transistor, comprising:
  an element isolation region that defines an active region;
  a source region in the active region;
  a drain region in the active region;
  a gate insulating film on a channel region,
    wherein the channel region is between the source region and the drain region; and
  a gate electrode on the gate insulating film, wherein
    a first length of the gate electrode at border parts of the gate electrode is longer than a second length of the gate electrode at a channel center part of the gate electrode,
    each of the border parts of the gate electrode is between the element isolation region and the active region,
    each of the first length and the second length is in a gate length direction,
    a first thickness of the gate insulating film at the border parts is greater than a second thickness of the gate insulating film at the channel center part,
    the channel center part of the gate electrode is between the border parts of the gate electrode, in a gate width direction, and
    the gate electrode has an electrode shape in which a potential at the border parts is shallower than a potential at the channel center part.

10. A solid-state image sensor, comprising:
a pixel array unit including a plurality of unit pixels, wherein the plurality of unit pixels includes a photoelectric conversion element arranged in a matrix; and a circuit unit including a MOS field-effect transistor, wherein the circuit unit is configured to process a signal read from a unit pixel of the plurality of unit pixels, wherein the MOS field-effect transistor includes:
an element isolation region that defines an active region,
a source region in the active region,
a drain region in the active region,
a gate insulating film on a channel region,
wherein the channel region is between the source region and the drain region, and
a gate electrode on the gate insulating film, wherein
a first length of the gate electrode at border parts of the gate electrode is longer than a second length of the gate electrode at a channel center part of the gate electrode,
each of the border parts of the gate electrode is between the element isolation region and the active region,
each of the first length and the second length is in a gate length direction,
a first thickness of the gate insulating film at the border parts is greater than a second thickness of the gate insulating film at the channel center part,
the channel center part of the gate electrode is between the border parts of the gate electrode, in a gate width direction, and
the gate electrode has an electrode shape in which a potential at the border parts is shallower than a potential at the channel center part.

11. The solid-state image sensor according to claim 10, wherein
the circuit unit is a signal processing unit having an AD converting device,
the AD converting device includes a comparator for comparison of an output signal from each pixel of the plurality of unit pixels with a reference signal, and
the comparator includes the MOS field-effect transistor.

12. The solid-state image sensor according to claim 10, wherein
the unit pixel includes an amplifying transistor configured to amplify the signal based on charge in the photoelectric conversion element, and
the amplifying transistor includes the MOS field-effect transistor.

13. An electronic device, comprising:
a solid-state image sensor as an imaging unit, wherein the solid-state image sensor includes:
a pixel array unit including a plurality of pixels, wherein:
each pixel in the plurality of pixels includes a photoelectric conversion element, and
the plurality of pixels is arranged in a matrix; and
a circuit unit including a MOS field-effect transistor, wherein:
the circuit unit is configured to process a signal read from the plurality of pixels,
the MOS field-effect transistor includes:
an element isolation region that defines an active region;
a source region in the active region,
a drain region in the active region;
a gate insulating film on a channel region, wherein the channel region is between the source region and the drain region; and
a gate electrode on the gate insulating film, wherein:
a first length of the gate electrode at border parts of the gate electrode is longer than a second length of the gate electrode at a channel center part of the gate electrode,
each of the border parts of the gate electrode is between the element isolation region and the active region,
each of the first length and the second length is in a gate length direction,
a first thickness of the gate insulating film at the border parts is greater than a second thickness of the gate insulating film at the channel center part,
the channel center part of the gate electrode is between the border parts of the gate electrode, in a gate width direction, and
the gate electrode has an electrode shape in which a potential at the border parts is shallower than a potential at the channel center part.

* * * * *